(12) United States Patent
Klersy et al.

(10) Patent No.: US 7,253,429 B2
(45) Date of Patent: *Aug. 7, 2007

(54) ELECTRICALLY PROGRAMMABLE MEMORY ELEMENT

(75) Inventors: Patrick Klersy, Lake Orion, MI (US); Tyler Lowrey, San Jose, CA (US)

(73) Assignee: Ovonyx, Inc., Rochester Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/981,826

(22) Filed: Nov. 5, 2004

(65) Prior Publication Data

US 2005/0062132 A1 Mar. 24, 2005

Related U.S. Application Data

(63) Continuation of application No. 09/921,038, filed on Aug. 2, 2001, now Pat. No. 6,815,705, and a continuation-in-part of application No. 09/276,273, filed on Mar. 25, 1999, now Pat. No. 6,969,866.

(51) Int. Cl.
*H01L 47/00* (2006.01)
(52) U.S. Cl. ............. 257/2; 257/3; 257/4; 257/E29.308; 438/95
(58) Field of Classification Search ............. 257/3, 257/4, 5, 2, E29.308; 438/95
See application file for complete search history.

(56) References Cited

U.S. PATENT DOCUMENTS 6,031,287 A * 2/2000 Harshfield ............. 257/734
6,815,705 B2 * 11/2004 Klersy et al. ............. 257/3

* cited by examiner

*Primary Examiner*—Phat X. Cao
(74) *Attorney, Agent, or Firm*—Kevin L. Bray; Marvin S. Siskind

(57) ABSTRACT

A programmable resistance memory element including a memory material which is raised above a semiconductor substrate by a dielectric layer.

8 Claims, 22 Drawing Sheets

ELECTRICALLY PROGRAMMABLE MEMORY ELEMENT

RELATED APPLICATION INFORMATION

This application is a continuation of U.S. patent application Ser. No. 09/921,038 filed on Aug. 2, 2001, U.S. Pat. No. 6,815,705, which is a continuation-in-part of U.S. patent application Ser. No. 09/276,273 filed on Mar. 25, 1999, U.S. Pat. No. 6,969,866.

FIELD OF THE INVENTION

The present invention relates generally to a uniquely designed solid state, electrically operated memory element. More specifically, the present invention relates to programmable resistance memory elements.

BACKGROUND AND PRIOR ART

Programmable resistance memory elements formed from materials that can be programmed to exhibit at least a high or low stable resistance state are known in the art. Such programmable resistance elements may be programmed to a high resistance state to store, for example, a logic ONE data bit. As well, they may be programmed to a low resistance state to store, for example, a logic ZERO data bit.

One type of material that can be used as the memory material for programmable resistance elements is phase change material. Phase change materials may be programmed between a first structural state where the material is generally more amorphous (less ordered) and a second structural state where the material is generally more crystalline (more ordered). The term "amorphous", as used herein, refers to a condition which is relatively structurally less ordered or more disordered than a single crystal and has a detectable characteristic, such as high electrical resistivity. The term "crystalline", as used herein, refers to a condition which is relatively structurally more ordered than amorphous and has lower electrical resistivity than the amorphous state.

The concept of utilizing electrically programmable phase change materials for electronic memory applications is disclosed, for example, in U.S. Pat. Nos. 3,271,591 and 3,530,441, the contents of which are incorporated herein by reference. The early phase change materials described in the '591 and '441 Patents were based on changes in local structural order. The changes in structural order were typically accompanied by atomic migration of certain species within the material. Such atomic migration between the amorphous and crystalline states made programming energies relatively high.

The electrical energy required to produce a detectable change in resistance in these materials was typically in the range of about a microjoule. This amount of energy must be delivered to each of the memory elements in the solid state matrix of rows and columns of memory cells. Such high energy requirements translate into high current carrying requirements for the address lines and for the cell isolation/address device associated with each discrete memory element.

The high energy requirements for programming the memory cells described in the '591 and '441 patents limited the use of these cells as a direct and universal replacement for present computer memory applications, such as tape, floppy disks, magnetic or optical hard disk drives, solid state disk flash, DRAM, SRAM, and socket flash memory. In particular, low programming energy is important when the EEPROMs are used for large-scale archival storage. Used in this manner, the EEPROMs would replace the mechanical hard drives (such as magnetic or optical hard drives) of present computer systems. One of the main reasons for this replacement of conventional mechanical hard drives with EEPROM "hard drives" would be to reduce the power consumption of the mechanical systems. In the case of lap-top computers, this is of particular interest because the mechanical hard disk drive is one of the largest power consumers therein. Therefore, it would be advantageous to reduce this power load, thereby substantially increasing the operating time of the computer per charge of the power cells. However, if the EEPROM replacement for hard drives has high programming energy requirements (and high power requirements), the power savings may be inconsequential or at best unsubstantial. Therefore, any EEPROM which is to be considered a universal memory requires low programming energy.

The programming energy requirements of a programmable resistance memory element may be reduced in different ways. For example, the programming energies may be reduced by the appropriate selection of the composition of the memory material. An example of a phase change material having reduced energy requirements is described in U.S. Pat. No. 5,166,758, the disclosure of which is incorporated by reference herein. Other examples of memory materials are provided in U.S. Pat. Nos. 5,296,716, 5,414,271, 5,359,205, and 5,534,712 disclosures of which are all incorporated by reference herein.

The programming energy requirement may also be reduced through the appropriate modification of the electrical contacts used to deliver the programming energy to the memory material. For example, reduction in programming energy may be achieved by modifying the composition and/or shape and/or configuration (positioning relative to the memory material) of the electrical contacts. Examples of such "contact modification" are provided in U.S. Pat. Nos. 5,341,328, 5,406,509, 5,534,711, 5,536,947, 5,687,112, 5,933,365 all of which are incorporated by reference herein. Examples are also provided in U.S. patent application Ser. No. 09/276,273 the disclosure of which is incorporated herein by reference. Examples are also provided in U.S. patent application Ser. No. 09/620,318 the disclosure of which is incorporated herein by reference. More examples are provided in U.S. patent application Ser. No. 09/677,957 the disclosure of which is incorporated herein by reference. The present invention is directed to novel structures of a programmable resistance memory element and methods for making these structures.

SUMMARY OF THE INVENTION

One aspect of the present invention is an electrically operated memory element, comprising: a substrate; a pore of programmable resistance material formed above the substrate, the pore having a minimum lateral dimension less than 1300 Angstroms; and a first dielectric layer formed between the pore and the substrate, at least a portion of the dielectric underlying at least a portion of the pore.

Another aspect of the present invention is an electrically operated memory element, comprising: a substrate; a pore of programmable resistance material formed above the substrate, the pore having a minimum lateral dimension less than a photolithographic limit; and a first dielectric layer formed between the pore and the substrate, at least a portion of the dielectric underlying at least a portion of the pore.

Another aspect of the present invention is an electrically programmable memory element, comprising: a first dielectric layer; a first conductive layer formed over the first dielectric layer; a second dielectric layer formed over the first conductive layer, the second dielectric layer having a pore therein, the pore having a minimum lateral dimension less that 1300 Angstroms; a programmable resistance material disposed within the opening; and a second conductive layer formed over the programmable resistance material.

Another aspect of the present invention is an electrically programmable memory element, comprising: a first dielectric layer; a first conductive layer formed over the first dielectric layer; a second dielectric layer formed over the first conductive layer, the second dielectric layer having a pore therein, the pore sized smaller that a photolithographic limit; a programmable resistance material disposed within the pore; and a second conductive layer formed over the programmable resistance material.

Another aspect of the present invention is an electrically programmable memory element, comprising: a first dielectric layer; a first conductive layer formed over the first dielectric layer; a second dielectric layer formed over the first conductive layer, the second dielectric layer having an opening therethrough to the first conductive layer; a spacer disposed about a peripheral portion of the opening to form a pore; a programmable resistance material disposed within the pore; and a second conductive layer formed over the programmable resistance material.

Another aspect of the present invention is an electrically operated memory element comprising: a first conductive layer; a first dielectric layer disposed over the first conductive layer, the first dielectric layer having an opening formed therein; a dielectric spacer disposed about a peripheral portion of the opening to form a pore, the spacer formed by depositing a second dielectric layer over the opening and removing a portion of the second dielectric layer; a programmable resistance material disposed in the pore; and a second conductive layer disposed over the programmable resistance material.

Another aspect of the present invention is an electrically operated memory element, comprising: a substrate; a first dielectric layer formed over the substrate, the first dielectric layer having a sidewall surface formed therein; a first conductive layer disposed on the sidewall surface; a second dielectric layer disposed over the first conductive layer, wherein an edge portion of the first conductive layer is exposed on the sidewall surface; a second conductive layer disposed over at least a portion of the exposed edge portion; and a programmable resistance material electrically coupled to the second conductive layer.

Another aspect of the present invention is an electrically operated memory element, comprising: a programmable resistance material; and an electrode electrically coupled to the programmable resistance material, the electrode comprising a first conductive layer adjacent to the memory material and a second conductive layer remote to the memory material, the second conductive layer being edgewise adjacent to the first conductive layer.

Another aspect of the present invention is a method of fabricating a pore, comprising: providing a first material layer; forming a second material layer over the first material layer; forming an opening in the second material layer therethrough to the first material layer; disposing a third material layer over the opening; and removing a portion of the third material layer.

Another aspect of the present invention is A method of fabricating a programmable resistance memory element, comprising: providing a first conductive layer; forming a first dielectric layer over the first conductive layer; forming an sidewall surface in the first dielectric layer; forming a second dielectric layer onto the sidewall surface; and removing a portion of the second dielectric layer to define a pore in the first dielectric layer; forming a layer of programmable resistance material into the pore; and forming a second conductive layer over the layer of programmable resistance material.

DETAILED DESCRIPTION OF THE INVENTION

In the following paragraphs and in association with the accompanying figures, examples of memory devices formed according to embodiments of the invention are presented. Specific embodiments of memory elements and methods of making such memory elements are described below as they might be implemented for use in semiconductor memory circuits. In the interest of clarity, not all features of an actual implementation are described in this specification.

Figure 1:
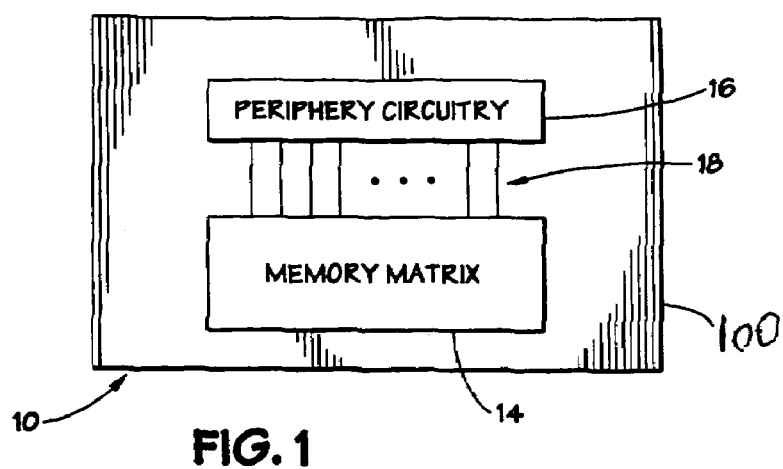
FIG. 1 shows a high-level diagram of a memory device of the present invention including a memory array and periphery circuitry formed on a substrate.

Turning now to the drawings, and referring initially to FIG. 1, a memory device is illustrated and generally designated by a reference numeral 10. The memory device 10 is an integrated circuit memory formed on a semiconductor substrate 100. The memory device 10 includes a memory matrix or array 14 that includes a plurality of memory cells for storing data. The memory matrix 14 is coupled to periphery circuitry 16 by the plurality of control lines 18. The periphery circuitry 16 may include circuitry for addressing the memory cells contained within the memory array 14, along with circuitry for storing data in and retrieving data from the memory cells. The periphery circuitry 16 may also include other circuitry used for controlling or otherwise insuring the proper functioning of the memory device 10.

Figure 2A:
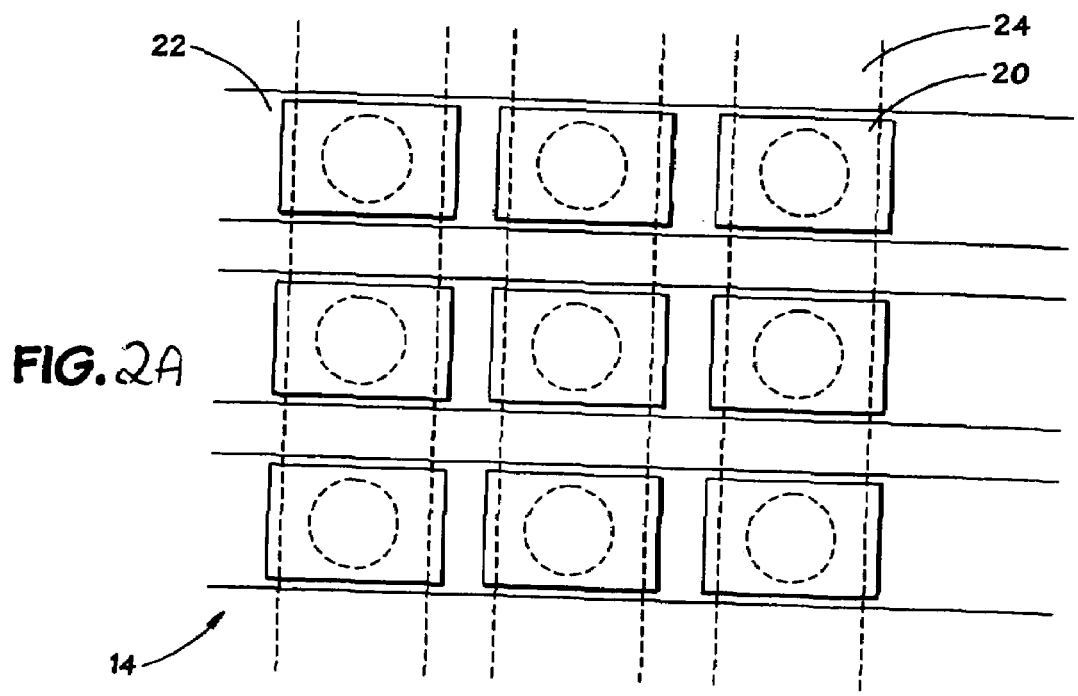
FIG. 2A shows a high-level diagram of a memory array of the present invention.

A top view of the memory array 14 is shown in FIG. 2A. As can be seen, the memory array includes a plurality of memory cells 20 that are arranged in generally perpendicular rows and columns. As can be seen, the memory array 14 includes a plurality of memory cells 20 that are arranged in generally perpendicular rows and columns. The memory cells 20 in each row are coupled together by a respective wordline 22, and the memory cells 20 in each column are coupled together by a respective bitline 24.

Figure 2B:
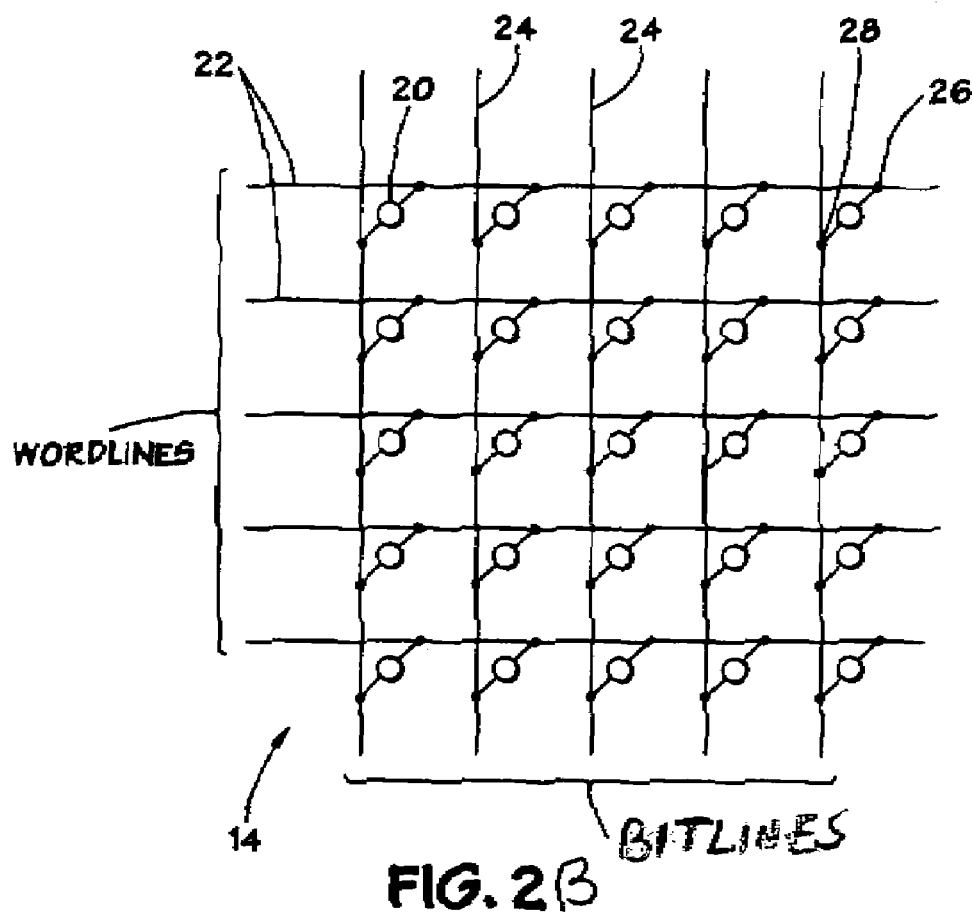
FIG. 2B is a schematic diagram of a memory array of the present invention.

A schematic diagram of the memory array 14 is shown in FIG. 2B. As can be seen, each memory cell 20 includes a wordline node 26 that is coupled to a respective wordline 22, and each memory cell 20 includes a bitline node 28 that is coupled to a respective bitline 24. The conductive wordlines 22 and bitlines 24 are collectively referred to as address lines. These address lines are electrically coupled to the periphery circuitry 16 (shown in FIG. 1) so that each of the memory cells 20 can be accessed for the storage and retrieval of information.

Figure 3:
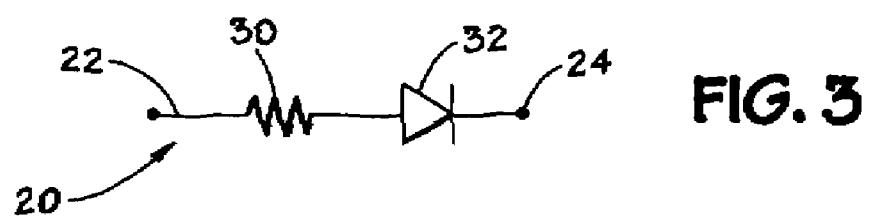
FIG. 3 is a schematic diagram of a memory cell incorporating a programmable resistance memory material.

FIG. 3 illustrates an exemplary memory cell 20 that may be used in the memory array 14. The memory cell 20 includes a memory element 30 which is coupled to an access device 32. The access device electrically isolates each memory element from all other memory elements in the array. In this embodiment, the memory element 30 is illustrated as a programmable resistive element, and the access device 32 is illustrated as a diode. The programmable resistive element may be made of a chalcogenide material, as will be more fully explained below. As illustrated in FIG. 3, the memory element 30 is coupled to a wordline 22, and the access device 32 is coupled to a bitline 24. However, it should be understood that connections of the memory element 20 may be reversed without adversely affecting the operation of the memory array 14.

Figure 13:
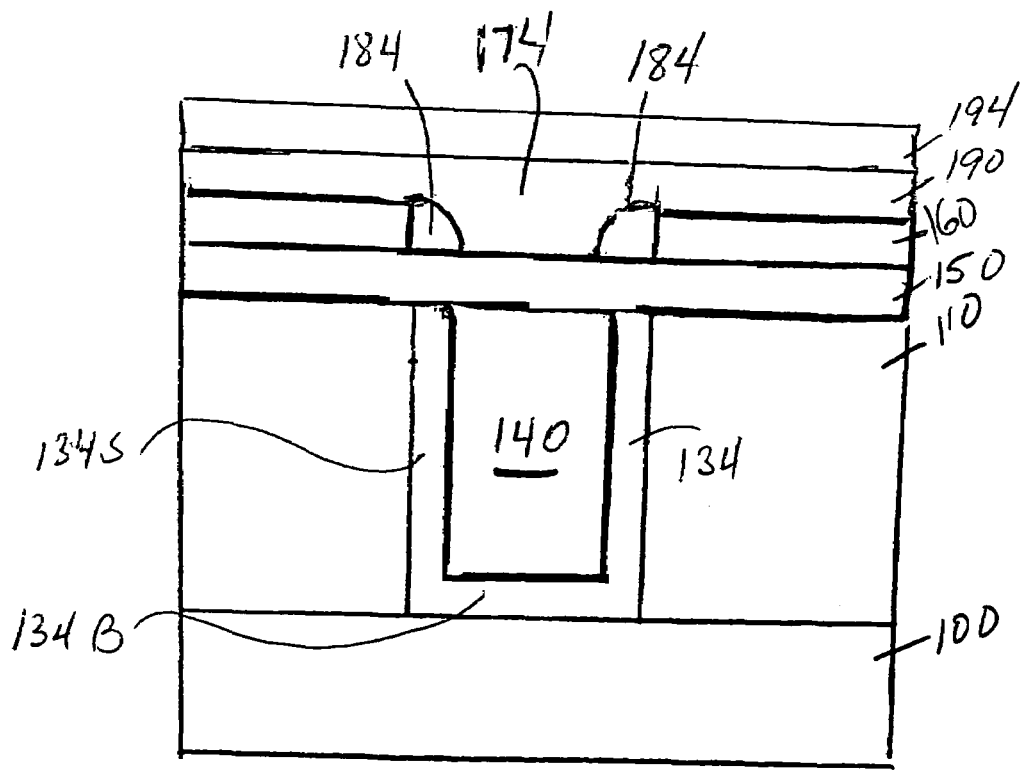

The actual structure of an exemplary memory cell 20 is illustrated in FIG. 13, while a method for fabricating the memory cell 20 is described with reference to FIGS. 4-13. It should be understood that while the fabrication of only a single memory cell 20 is discussed below, a plurality of similar memory cells may be fabricated simultaneously. Although not illustrated, each memory cell is electrically isolated from other memory cells in the array in any suitable manner, such as by the addition of imbedded field oxide regions between each memory cell.

Figure 4:
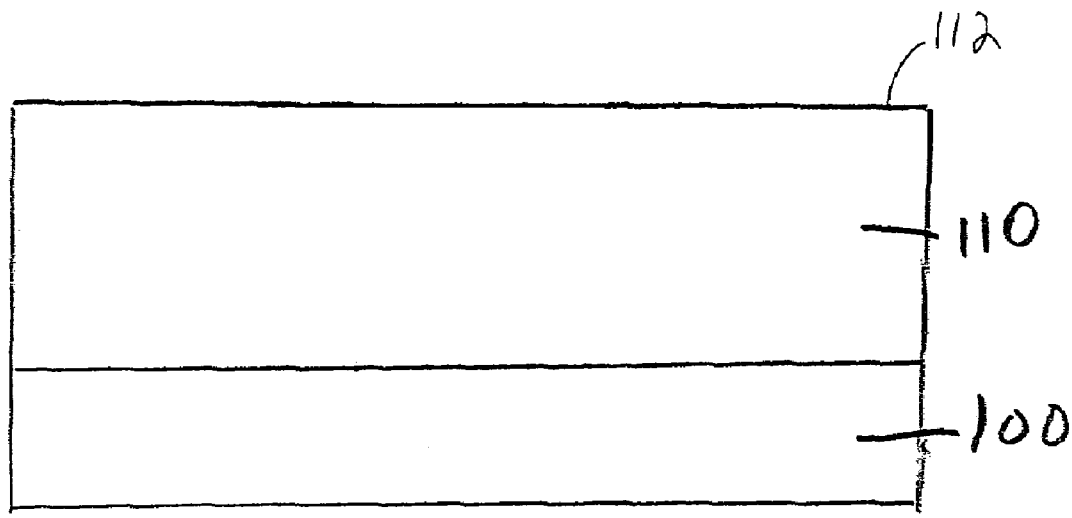
FIGS. 4 through 13 shows a process for making an embodiment of the memory cell of the present invention.

Referring first to FIG. 4, a semiconductor substrate 100 is provided. The substrate 100 may include the access devices as well as the bitlines and/or wordlines. A layer of dielectric material 110 is formed on top of the substrate 100. The layer 110 may be comprised of any suitable dielectric material, such as silicon nitride or silicon dioxide. The dielectric layer 110 may be formed in any suitable manner, such as by chemical vapor deposition (CVD). The dielectric layer 110 has a top surface 112.

Figure 5:
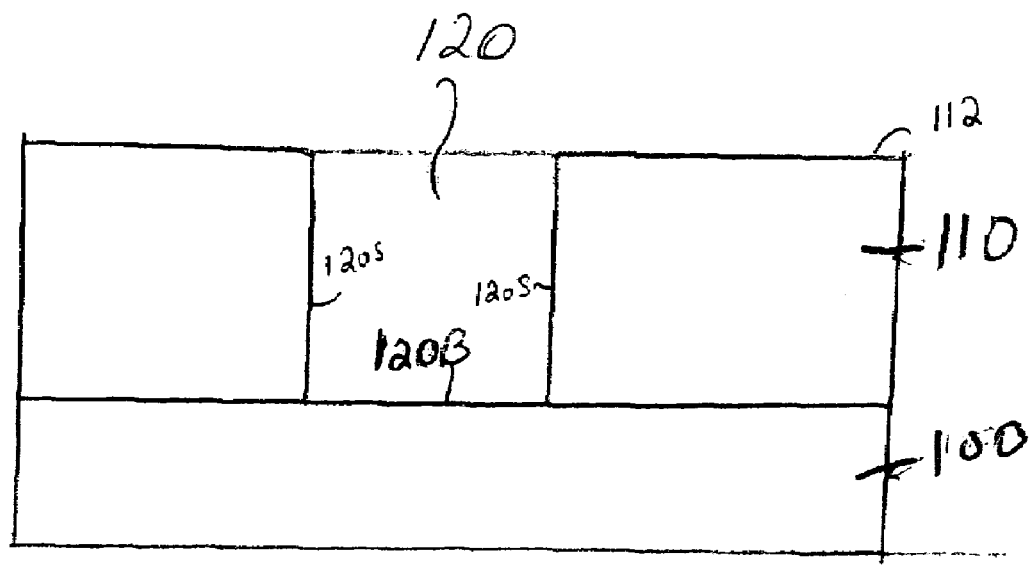

Referring to FIG. 5, an opening 120 (also referred as a "window") is formed through the dielectric layer 110 to expose a portion of the underlying substrate. Generally, the opening 120 may be any shape. For example, the opening 120 may be formed as a generally rectangular or circular hole. Alternately, the opening 120 may be formed as a trench. The opening 120 is preferably a substantially circular hole. The opening 120 includes the sidewall surface 120S about the periphery of the opening and the bottom surface 120B.

Any suitable method of forming the opening 120 may be used. For example, using standard photolithographic techniques, a hard mask (not shown) may be deposited on top of the dielectric layer 110 and patterned in the size and shape of the resulting opening 120. Hence, the opening 120 may be sized at the photolithographic limit.

Figure 6:
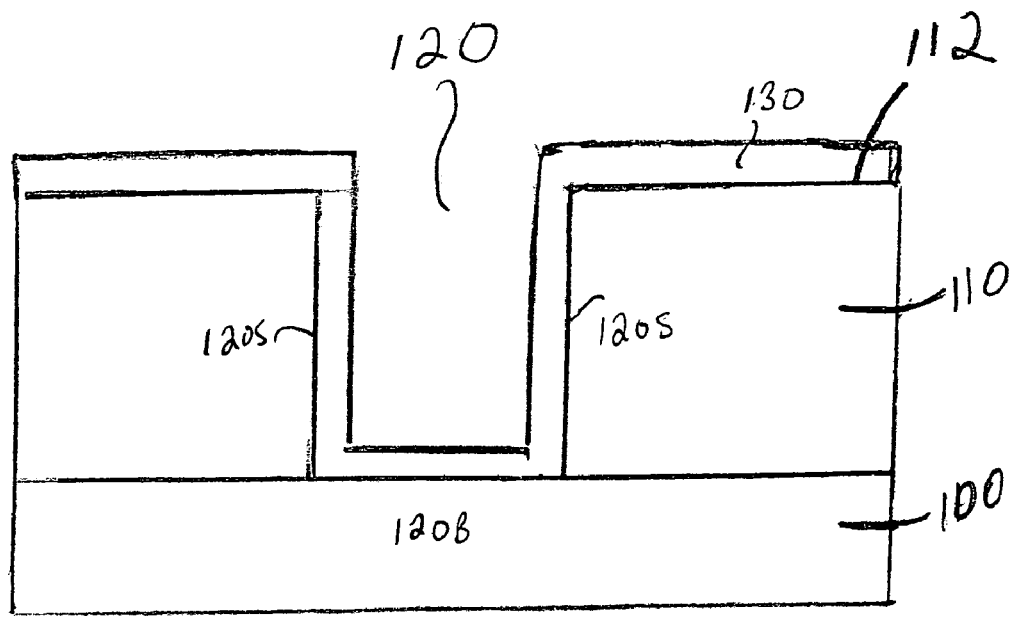
Figure 7:
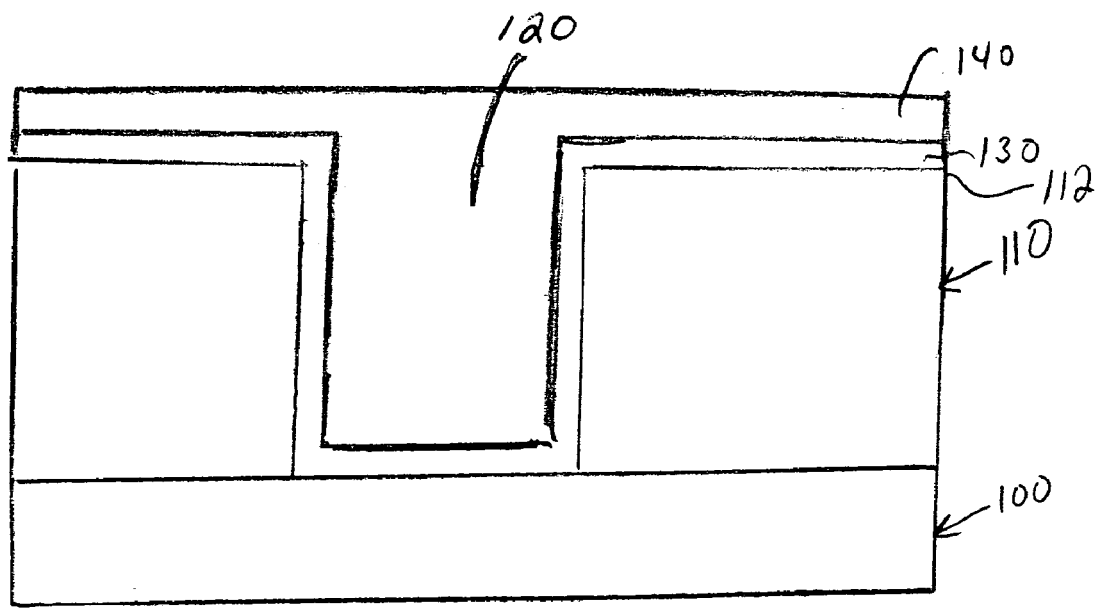
Figure 8:
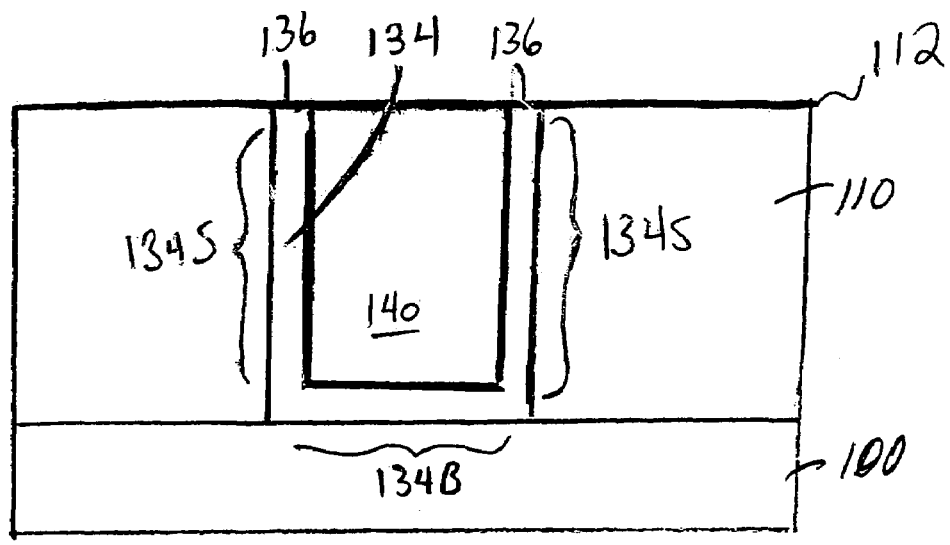

Referring to FIG. 6, a layer 130 of conductive material, such as titanium nitride, is substantially conformally deposited onto the top surface 112 of the dielectric layer 110 and into the opening 120. In particular, the layer 140 is deposited onto the sidewall surface 120S and onto the bottom surface 120B of the opening 122. A layer 140 of dielectric material is then deposited over the layer 130 of conductive material as shown in FIG. 7. Preferably, the layer 140 fills the opening 120. As shown in FIG. 8, excess conductive material 130 and dielectric material 140 (i.e., material above the top surface 112 of opening 120) is removed using a chemical mechanical planarization (or another method that accomplishes similar results). The remaining portion of the conductive layer 130 forms the conductive sidewall liner 134 (also referred to as a "conductive liner"). The conductive liner 134 includes the sidewall layer portion 134S and the bottom layer portion 134B. The sidewall layer portion 134S is preferably substantially vertically disposed. The dimensions of the conductive liner 144 will be determined substantially by the thickness of the conductive layer 140 deposition. The chemical mechanical planarization (CMP) process also exposes an edge portion 136 of the conductive liner 134.

In the example shown in FIG. 8, the conductive liner is cylindrically shaped and the exposed edge portion 136 forms an annularly shaped contact surface. As discussed above, the opening 120 may also be formed as a trench. In this case, the resulting conductive sidewall liner would be U-shaped having a bottom surface and two sidewall surfaces. The resulting exposed edge portion of the U-shaped liner would be two linear contact surfaces.

Figure 9:
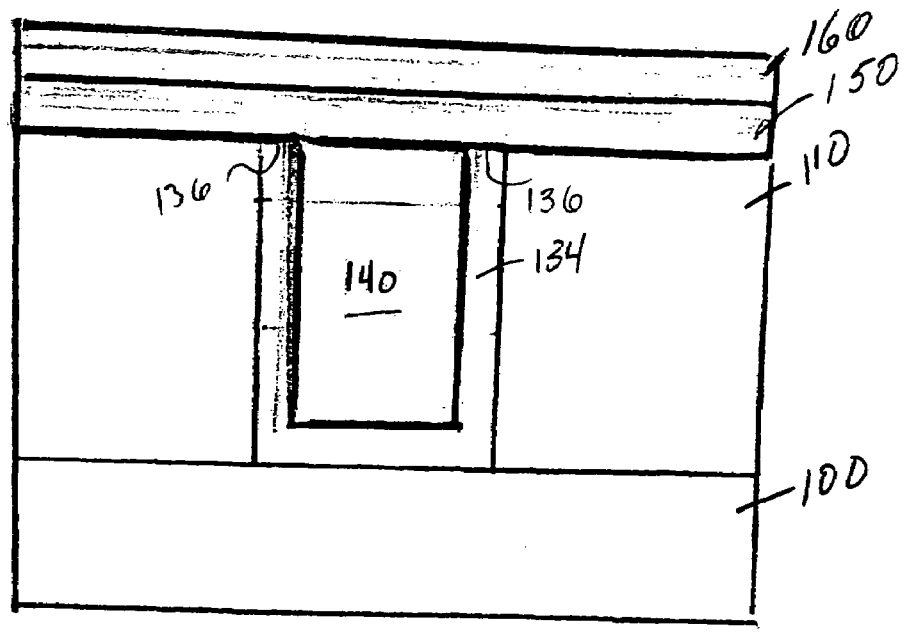

Referring to FIG. 9, a layer 150 of conductive material is deposited onto the top surface of the structure shown in FIG. 8. The layer 150 is deposited onto at least a portion of the exposed edge portion 136. The conductive layer 150 may be deposited by any suitable manner such as by chemical vapor deposition or by physical vapor deposition. Preferably, the layer 150 is formed from a conductive material having a resistivity which is greater than the resistivity of the conductive sidewall liner 134. The layer 150 is thus referred to herein as the "resistive" layer 150. The resistive layer 150 and the conductive liner 134 form the top and bottom portions, respectively, of a lower electrode for the memory element. The sidewall liner 134 (the bottom portion) electrically couples the resistive layer 150 (the top portion) to a conductive portion of the substrate 100.

It is noted that the conductive liner is "edgewise" adjacent to the resistive layer 150 whereby only all or a portion of the edge portion 136 is adjacent to the memory material while the remainder of the conductive liner is remote to the memory material. Hence, all electrical communication between the conductive liner 134 and the resistive layer 150 is through the edge portion 136 of the conductive liner.

Still referring to FIG. 9, a dielectric layer 160 is then deposited over the resistive layer 150. The dielectric layer 160 is preferably formed from the deposition of an oxide such as TEOS oxide or from the plasma enhanced chemical vapor deposition of silicon dioxide (PECVD oxide).

Figure 10:
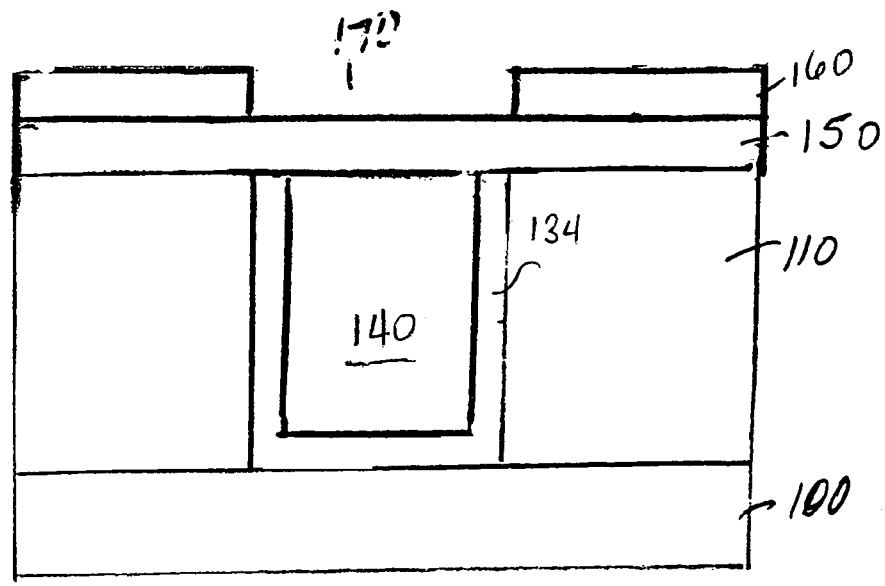

Referring to FIG. 10, an opening 170, extending to the resistive layer 150, is then etched in the dielectric layer 160. Preferably, the shape of the opening 170 is the same as the shape of opening 120 and may, for example, be formed as a substantially circular hole, substantially a rectangular hole, or as a trench. The opening 170 may be formed in many different ways. For example, the opening 170 may be formed using conventional photolithographic techniques and thus may be sized to have a minimum lateral dimension (for example, the diameter or width of the opening) at or about the photolithographic limit. Preferably, the opening 170 is formed using a contact hole mask resulting in a substantially circular opening. The opening 170 includes a bottom surface and a sidewall surface at its outer periphery. Preferably, the opening 170 is centered over the conductive liner 134.

Figure 11:
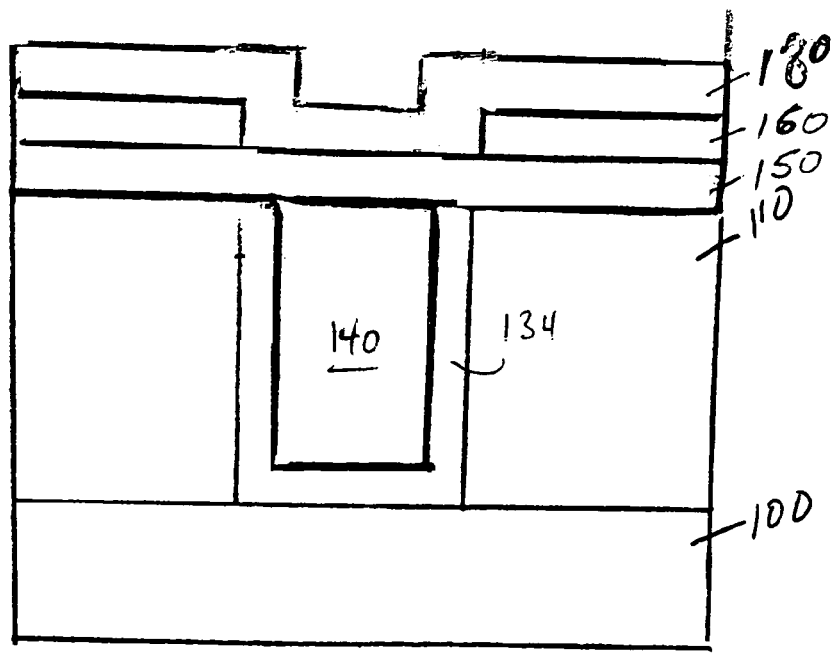
Figure 12:
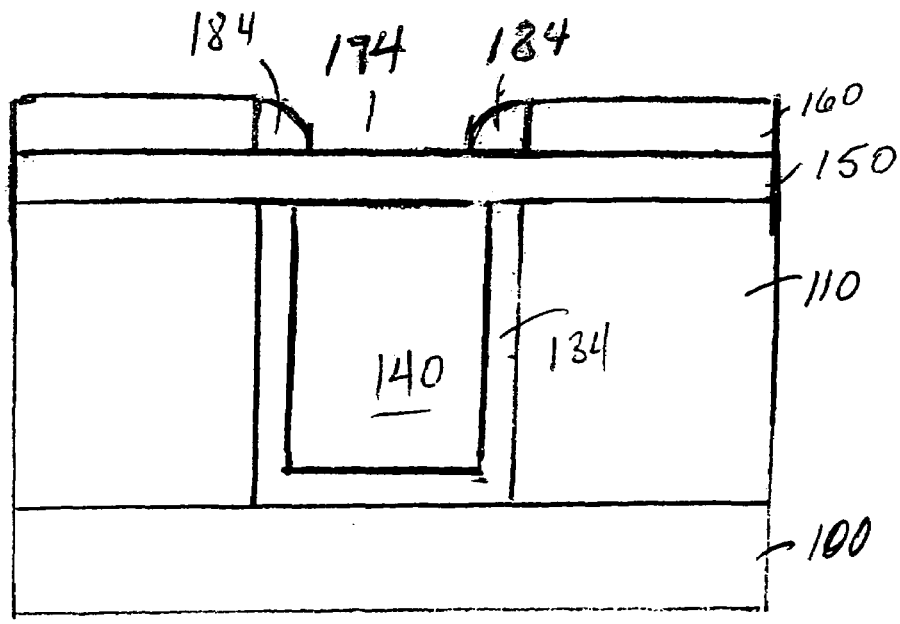

Referring to FIG. 11, a dielectric layer 180 is disposed into the opening 170. Preferably, the dielectric layer 180 is substantially conformally deposited onto the top surface of the dielectric layer 160 and onto the sidewall surface and bottom surface of the opening 170. The conductive layer 180 is then anisotropically etched to remove the horizontally disposed portions. The remaining portion of layer 180 is a sidewall layer that forms the cylindrically shaped dielectric sidewall spacer 184 (shown in FIG. 12) around the outer periphery of the opening 170. The dimensions of the dielectric spacer 184 will be determined substantially by the thickness of the dielectric layer 180. It is noted that the dielectric spacer 184 does not completely fill the opening 170. Instead, it leaves a smaller central opening 174 all the way down to the resistive layer 150. The smaller central opening 174 is also referred to as a pore 174. The minimum lateral dimension of the smaller central opening or pore 174 is preferably less than about 1300 Angstroms, more preferably less than about 1000 Angstroms, and most preferably less than about 600 Angstroms. It is conceivable that the minimum lateral dimension of the pore 174 may even be made less than about 100 Angstroms. As noted above, it is possible that the opening 170 may be sized so that its minimum lateral dimension is at the photolithographic limit. In this case, the smaller opening or pore 174 may thus be sized so that its minimum lateral dimension is smaller than the photolithographic limit.

Referring to FIG. 13, a layer of programmable resistance memory material 190 (preferably a phase-change material and more preferably a chalcogenide material) is then deposited over the dielectric layer 160 and into the pore 174. In the embodiment shown, the memory material 190 fills the pore 174. However, it is also possible that it does not fill the pore 174. A conductive layer 194 is then deposited over the memory material 190 to form an upper electrode for the memory element. The memory material may be deposited by methods such as sputtering, evaporation or chemical vapor deposition.

The resistive layer 150 serves as a heating layer to transfer thermal energy into the memory material (as well to provide electrical connectivity between the conductive sidewall liner 134 and the memory material). As electric charge moves through the resistive layer 150, the electric potential energy of the charge is converted to thermal energy. This effect is referred to as Joule heating. On a microscopic scale Joule heating can be understood as collisions between electrons and the material lattice which increases the amplitude of the thermal vibrations of the lattice. The rate of transfer of electrical energy to heat energy is directly proportional to the electrical resistivity of the material. Increasing the electrical resistivity of the material increases the rate at which heat energy is formed from electrical energy. Preferably, the electrical resistivity of the resistive layer 150 is chosen to provide adequate Joule heating. The resistive layer 150 may have an electrical resistivity which is preferably greater than about $1\times10^{-5}$ ohm-cm, more preferably greater than about $1\times10^{-3}$ ohm-cm, and most greater than about $1\times10^{-1}$ ohm-cm. At least a portion of the heat energy created within the resistive layer 150 as a result of Joule heating flows into at least a portion of the volume of the memory material, thereby heating the memory material.

The resistive layer 150 is preferably deposited sufficiently thin so that the thermal conducting properties of the layer does not dominate the thermal environment of the memory material. The resistive layer 150 may be deposited to a thickness which is preferably between about 50 Å to about 2000 Å, more preferably between about 100 Å to about 1000 Å, and most preferably between about 150 Å to about 500 Å.

The resistive layer 150 may include one or more elements selected from the group consisting of Ti, V, Cr, Zr, Nb, M, Hf, Ta, W, and mixtures or alloys thereof, and one or more elements selected from the group consisting of B, C, N, O, Al, Si, P, S, and mixtures or alloys thereof. Examples of materials include titanium nitride, titanium aluminum nitride, titanium carbonitride, and titanium silicon nitride. The titanium aluminum nitride, titanium carbonitride, titanium siliconitride have excellent barrier properties, preventing both the diffusion and electromigration of foreign material into the chalcogenide memory material. Other examples of materials include amorphous carbon, amorphous silicon or a dual amorphous carbon/amorphous silicon structure.

Both the substrate 100 as well as the conductive liner 134 comprise thermally conductive materials and are thus heat sinks. Hence, a portion of the thermal energy generated by the resistive layer 150 will flow into the substrate and conductive liner rather than into the memory material (leaving less thermal energy available to heat the memory material). Likewise, some of the thermal energy within the memory material may also be drawn out of memory material by both the substrate 100 and conductive layer 134.

In the embodiment shown in FIG. 13, both the resistive layer 150 as well as the pore 174 of memory material are raised above the substrate and are remote to the substrate. The dielectric layer 140 is disposed between the resistive layer 150 and the substrate 100. The dielectric layer 140 is also positioned between the pore 174 of memory material and the substrate 100. Preferably, at least a portion of the dielectric layer 140 underlies at least a portion of the pore 174 of memory material. More preferably, at least a portion of the dielectric layer 140 underlies the entire pore 174.

While not wishing to be bound by theory, it is believed that the dielectric layer 140 behaves as thermal insulation to decrease the amount of thermal energy flowing from the resistive layer 150 and into either the substrate 100 or conductive liner 134. The dielectric layer 140 also thermally insulates the pore 174 of memory material from both the substrate and the conductive liner and thus decreases the rate at which thermal energy flows out from the pore. Hence, more thermal energy thus enters into and remains inside of the memory material. It is believed that this contributes to lowering the total amount of energy needed to program the memory element.

The dielectric layer 140 is preferably chosen to have good thermal insulation properties. The insulating properties of the dielectric depend upon the specific heat and thermal conductivity of the material. Decreasing the specific heat and/or the thermal conductivity of the material increases the thermally insulating properties of dielectric layer 140 thereby slowing the rate of heat loss from the pore 174 of memory material. Hence, manipulation of these material properties may be used as a means of controlling and optimizing the cooling rate of the memory material.

The dielectric layer 140 may have a thermal conductivity which is preferably less than about 0.2 joule-cm per $cm^2$-Kelvin-sec, more preferably less than about 0.01 joule-cm per $cm^2$-Kelvin-sec, and most preferably less than about 0.001 joule-cm per $cm^2$-Kelvin-sec. The dielectric layer 140 may have a specific heat capacity which is preferably less than about 3 joule per cm$^3$-Kelvin, more preferably less than about 1 joule per cm$^3$-Kelvin, and most preferably less than about 1 joule per cm$^3$-Kelvin.

The dielectric material 140 may include one or more materials selected from the group consisting of oxides, nitrides, oxynitrides, carbonites, carbonitrides, fluorides, sulfides, chlorides, carbides, borides, phosphides, and mixtures or alloys thereof. Alternately, at least one thermal insulation layer may include an organic dielectric material. Further examples of thermal insulation layer materials include spin-on glass and spin-on polymer. Still another example of a thermal insulation layer materials include silica.

The thickness of the dielectric layer 140 affects the insulating properties of the layer (and hence the cooling rate of the memory material). Generally, increasing the thickness of the dielectric layer increases its insulating properties, further slowing the cooling of the memory material. The dielectric layer 140, for example, may have a thickness which is preferably between about 100 Å to about 10,000 Å, more preferably between about 500 Å to about 7500 Å, and most preferably between about 1000 Å and about 5000 Å.

The conductive liner 134 provides electrical connectivity between the substrate 100 and the resistive layer. As noted, the conductive liner includes a bottom portion 134B and a sidewall portion 134S. The sidewall portion 134S is preferably substantially vertically disposed and thus allows the conductive liner to electrically couple the resistive layer 150 to the substrate 100 while also allowing for increased physical separation of the resistive layer 150 (and pore 174 of memory material) from the substrate 100. In the embodiment shown, the sidewall portion 134S is not directly under the pore 174 of memory material but is instead laterally displaced from the pore 174. This allows for the placement of the dielectric material 140 under that portion of the resistive layer 150 which underlies the pore 174 so that it can be most effective in thermally insulating the pore of memory material. The lateral displacement of the sidewall portion 134S (so that it is not directly under the pore) also increases the average distance between the pore of memory material and conductive liner material. Since, as discussed above, the conductive liner material acts as a heat sink, the lateral displacement of the sidewall portion 134S also serves to prevent heat transfer out from the pore 174 of memory material.

The conductive liner 134 is preferably formed from a material that has a resistivity which is less than the resistivity of the resistive layer 150. Examples of the materials that can be used to form the conductive liner 134 include, but are not limited to n-type doped polysilicon, p-type doped polysilicon, n-type doped silicon carbide, p-type doped silicon carbide, tungsten, titanium tungsten, tungsten silicide, molybdenum, and titanium nitride.

In the embodiment of the invention shown in FIG. 13, the sidewall spacer 184 is used to reduce the size of the opening 170 (shown in FIG. 10) to form a smaller opening or pore 174 (i.e., having a smaller minimum lateral dimension than the opening 170 shown in FIG. 10). Since, the opening 170 (as shown in FIG. 10) may be sized to have a minimum lateral dimension at the photolithographic limit, it is thus possible that the pore 174 may be formed to have a minimum lateral dimension which is actually less than the photolithographic limit.

The minimum lateral dimension of the pore 174 is preferably less than about 1300 Angstroms, more preferably less than about 1000 Angstroms and most preferably less than about 600 Angstroms. Reducing the minimum lateral dimension of the pore 174 of programmable resistance material reduces the area of contact between the programmable resistance material and the resistive layer 150 (i.e., the top portion of the lower electrode). While not wishing to be bound by theory it is believed that reducing the area of contact reduces the volume of the memory material which is programmed. This reduces the current and energy needed to program the memory device. Again, while not wishing to be bound by theory, it is further believed that reducing the pore size so that its minimum lateral dimension is preferably less than about 1300 Angstroms (more preferably less than about 1000 Angstroms, and most preferably less than about 600 Angstroms) may reduce the current and energy programming requirements to acceptable levels. It is possible that the minimum lateral dimension of the pore 174 may be formed so that it is less than a photolithographic limit.

In the embodiment shown in FIG. 13, a pore 174 is formed using a spacer 184 to reduce the size of opening 170. As noted above, the spacer is formed around the outer periphery of opening 170 to reduce its size and form pore 174. Small openings or pores may be formed in other ways as well. For example, small pores may be formed with the use of a "disposable" spacer. A process for making a small pore using a disposable spacer is shown in FIGS. 36 to 43.

Figure 36:
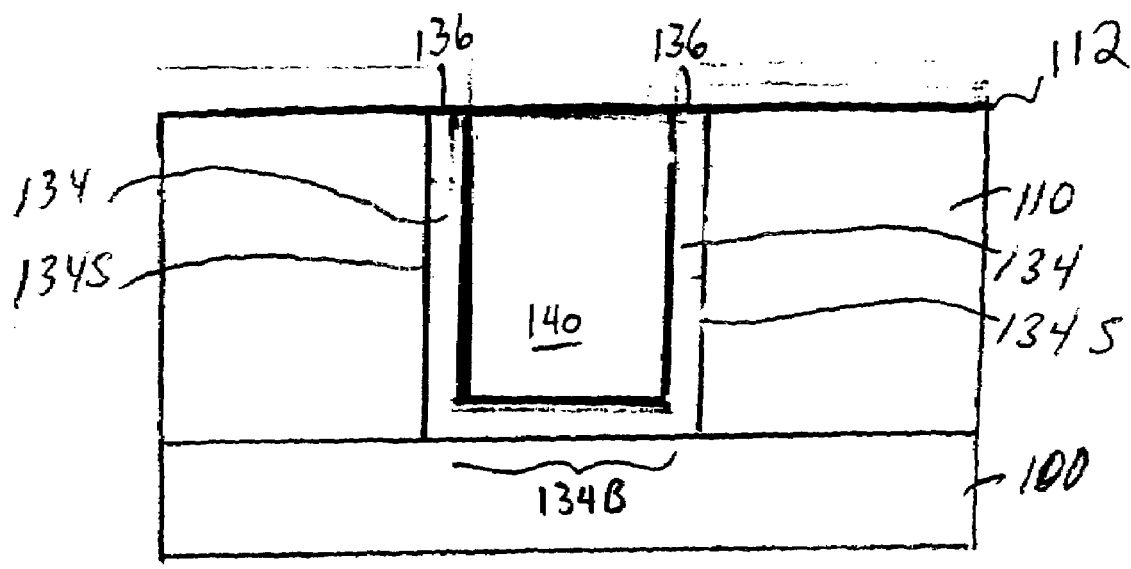
FIGS. 36 through 43 shows a process for making an embodiment of the present invention.
Figure 37:
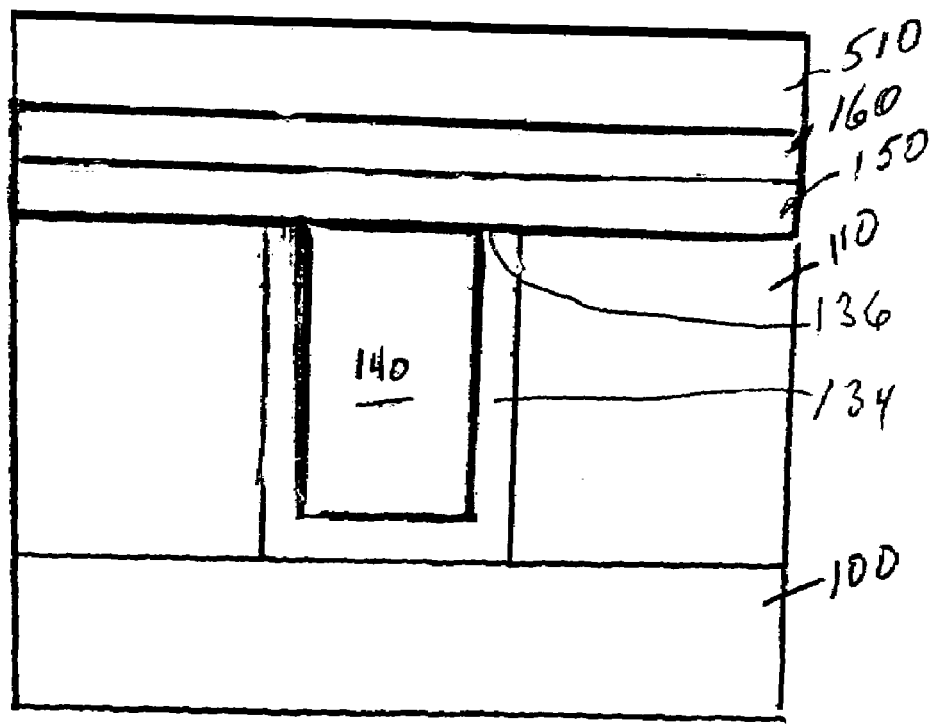
Figure 38:
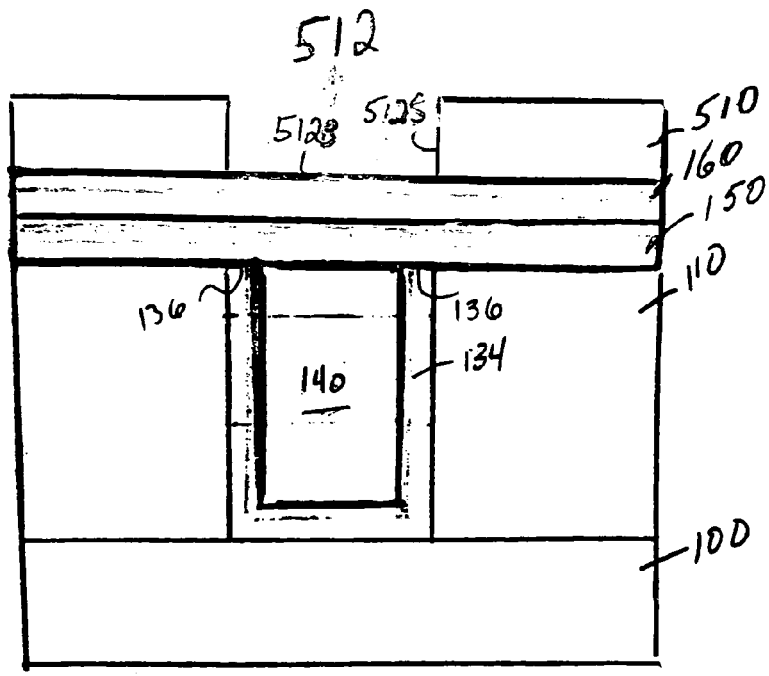

FIG. 36 shows the memory element at an intermediate stage of development (similar to FIG. 8). Referring to FIG. 37, a conductive material is deposited over the structure shown in FIG. 36 to form the resistive layer 150. A dielectric layer 160 is deposited over the resistive layer 150. A first disposable layer 510 is deposited over the dielectric layer 160. The layer 510 may be formed of a dielectric material such as an oxide (for example, TEOS oxide or PECVD oxide) or a nitride. Alternately, the layer 510 may be formed of polysilicon. Referring to FIG. 38, an opening 512 is then formed in the layer 510 preferably by conventional anisotropic etching techniques. The opening 512 may be formed as a rectangular or circular hole. Alternately, the opening 512 may be formed as a rectangular trench. Preferably, the opening 512 is formed using a conventional contact hole mask resulting in a substantially circular opening. The opening 512 includes a bottom surface 512B and a sidewall surface 512S. Preferably, the opening 512 is formed so that it extends downward to the dielectric layer 160 and thus exposes a portion of the layer 160.

Figure 39:
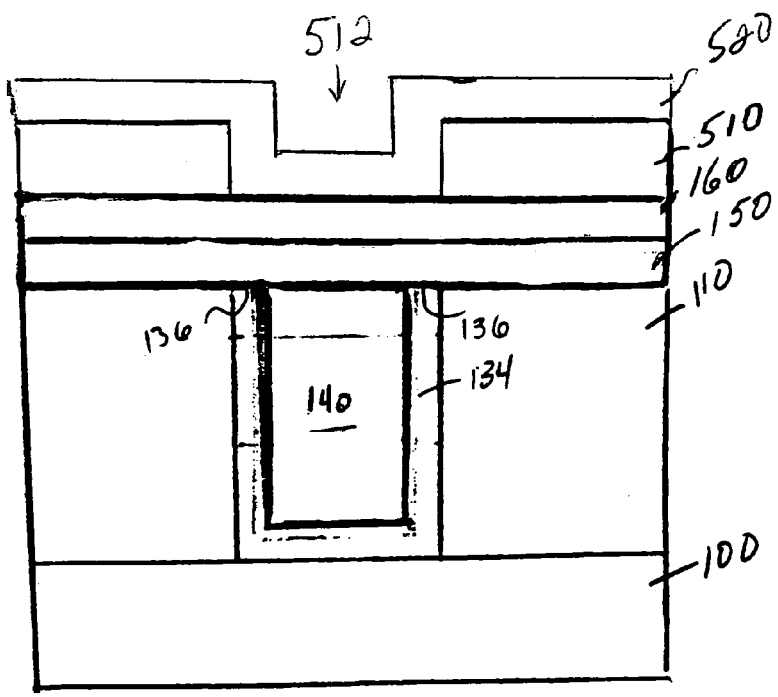

Referring to FIG. 39, a second disposable layer 520 is deposited onto the layer 510 and into the opening 512. More specifically, the layer 520 is preferably substantially conformally deposited onto the bottom surface 512B and sidewall surface 512S of the opening 512 using conventional deposition techniques. The layer 520 may be formed from a dielectric material (such as an oxide or a nitride) or from polysilicon. The layer 520 is preferably formed from the same material as layer 510.

Figure 40:
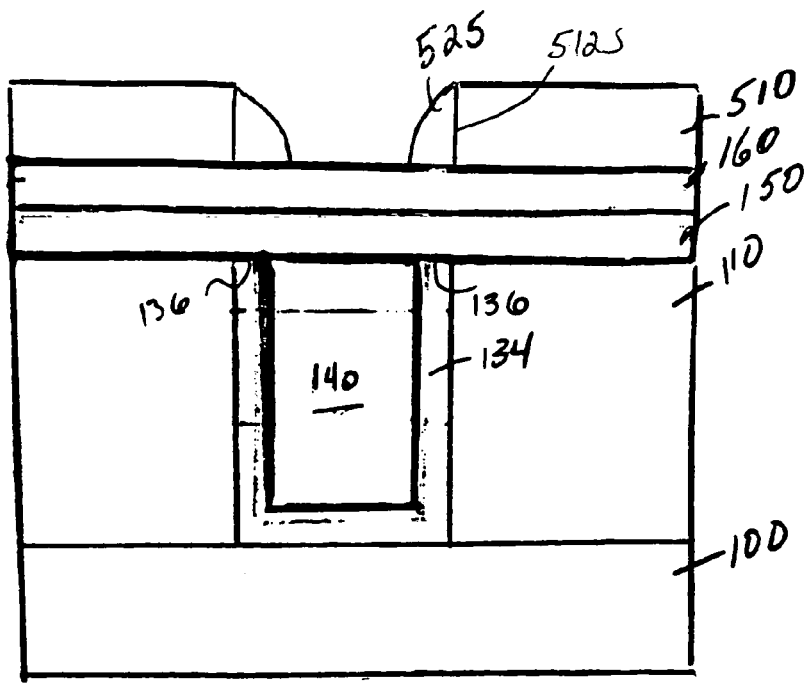

The layer 520 is then anisotropically etched to remove the horizontally disposed services and form the sidewall spacer 525 as shown in FIG. 40. The spacer 525 is formed on the sidewall surface 512S.

Figure 41:
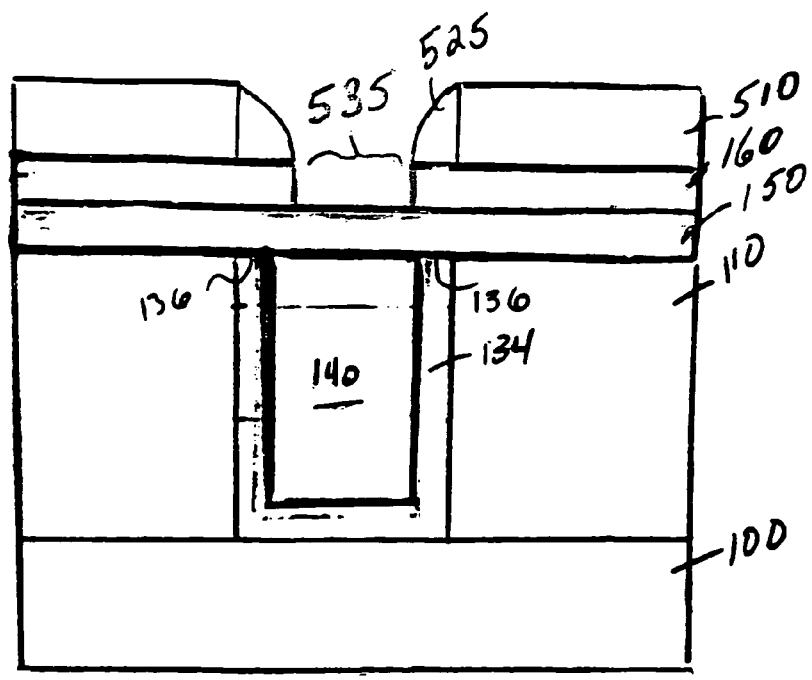

Referring to FIG. 41, the portion of the dielectric layer 160 that is not covered by the sidewall spacer 525 is then etched by conventional anisotropic techniques to from the opening or pore 535. The pore 535 extends downwardly to the resistive layer 150. It is possible that the pore 535 may be formed so that its minimum lateral dimension is preferably less than about 1300 Angstroms, more preferably less than about 1000 Angstroms and most preferably less than about 600 Angstroms. If opening 512 (as shown in FIG. 38)

is formed so that its minimum lateral dimension is at the photolithographic limit, then the opening or pore 535 will have a minimum lateral dimension which is less that the photolithographic limit.

Figure 42:
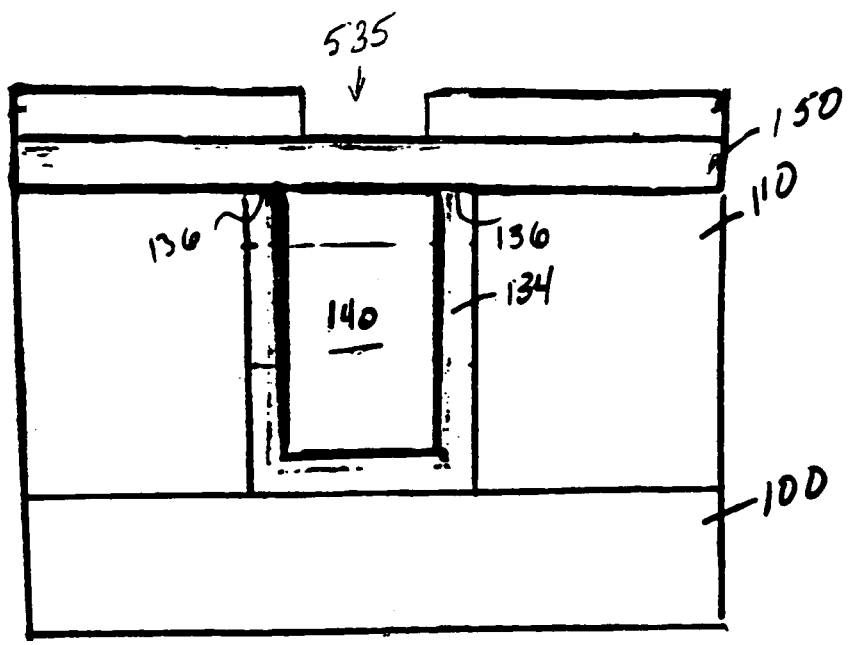
Figure 43:
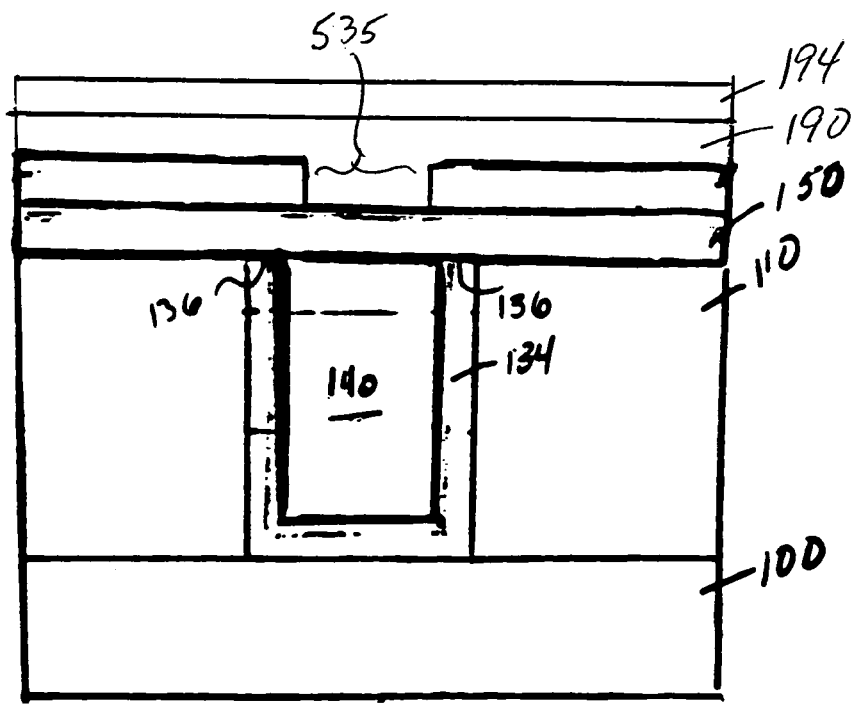

Referring to FIG. 42, the spacer 525 as well as the layer 510 are then removed, preferably by conventional etching techniques. Referring to FIG. 43, a layer 190 of a programmable resistance material is deposited into the pore 535. The layer 190 may or may not fill the pore 535. A layer 194 of a conductive material is deposited onto the programmable resistance material 190 to form an upper electrode for the memory element.

Figure 19:
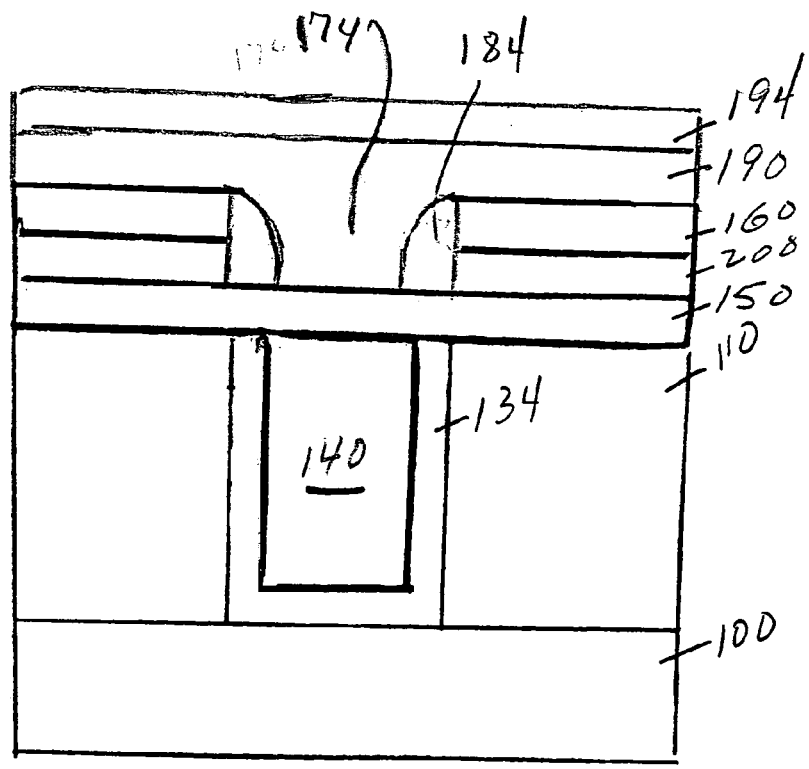

An alternate embodiment of the present invention is shown in FIG. 19. The embodiment shown in FIG. 19 includes a "strapping" layer 200 formed over the resistive layer 150. The "strapping" layer 200 is physically separated from the memory material 190 by the dielectric spacer 184 and the dielectric layer 160. The strapping layer 200 is formed from a conductive material, such as a titanium nitride, and is preferably formed from a material having a resistivity which is less than the resistivity of the resistive layer 150.

The strapping layer 200 provides for more uniform current flow through the area of contact between resistive layer 150 and the memory material 190. It reduces the possibility of current crowding in the resistive layer 150 if the patterning of the pore 174 is off-center relative to the central axis of the cylindrical sidewall liner 134.

Figure 14:
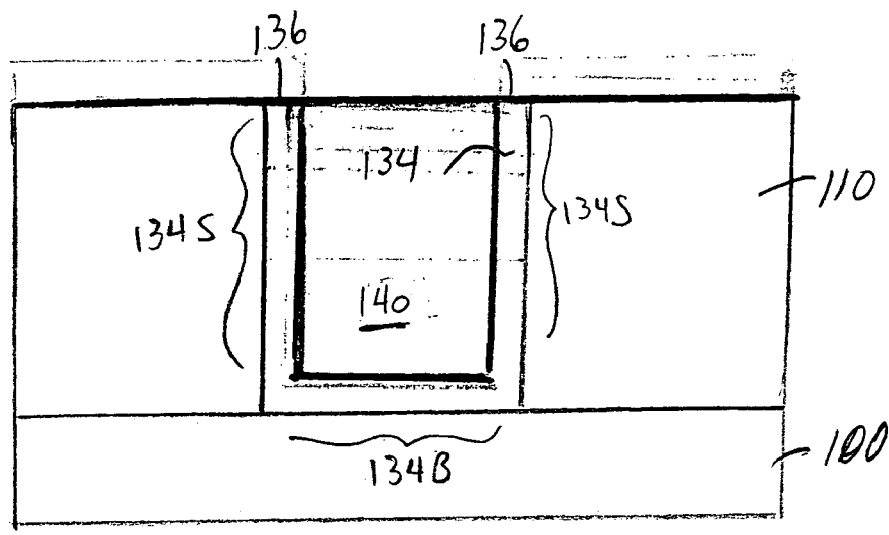
FIG. 14 through 19 shows a process for making an embodiment of a memory cell of the present invention.
Figure 15:
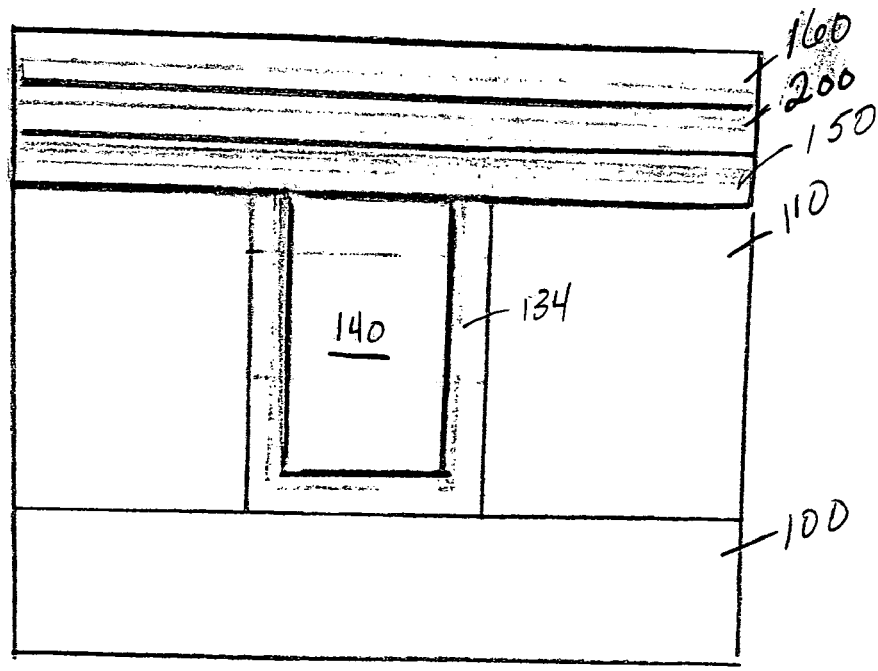
Figure 16:
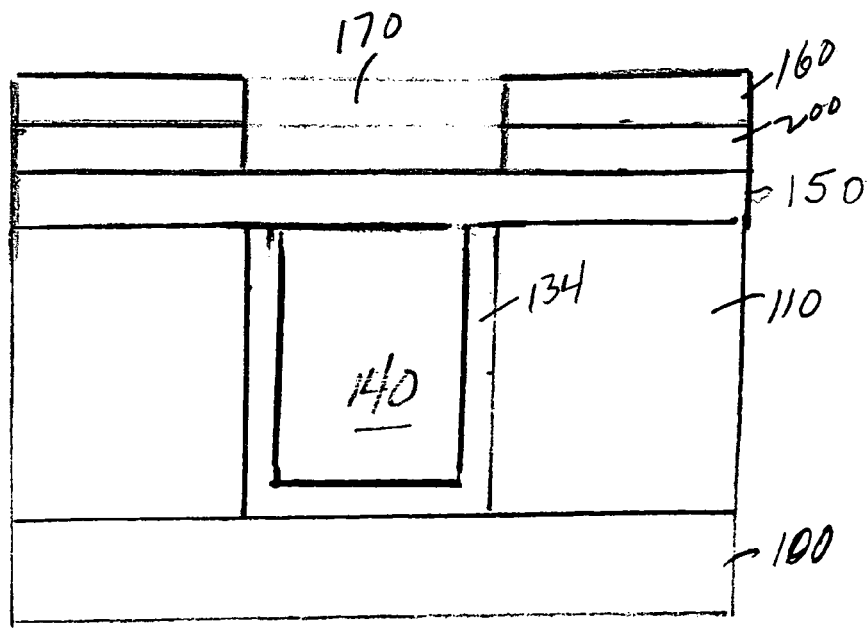
Figure 17:
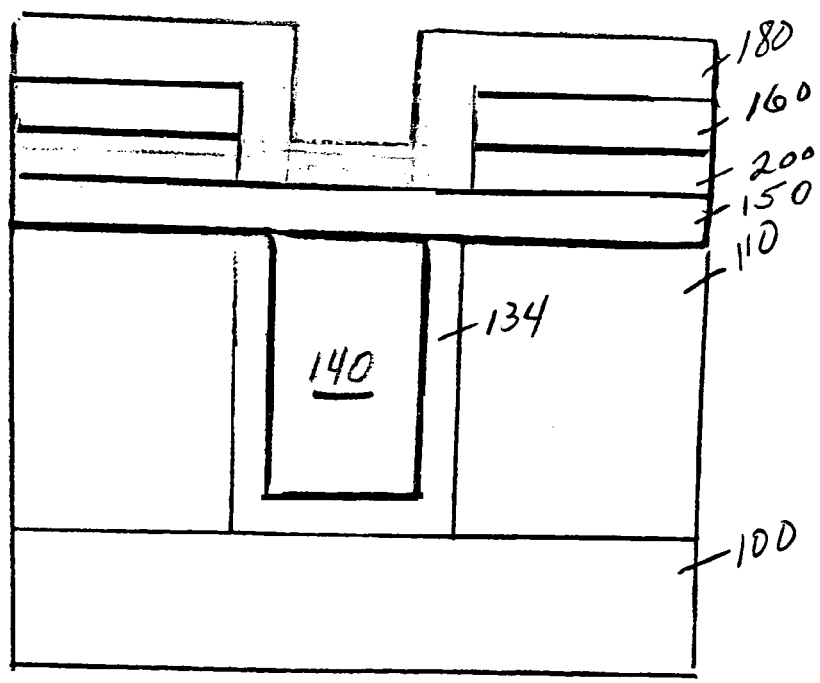
Figure 18:
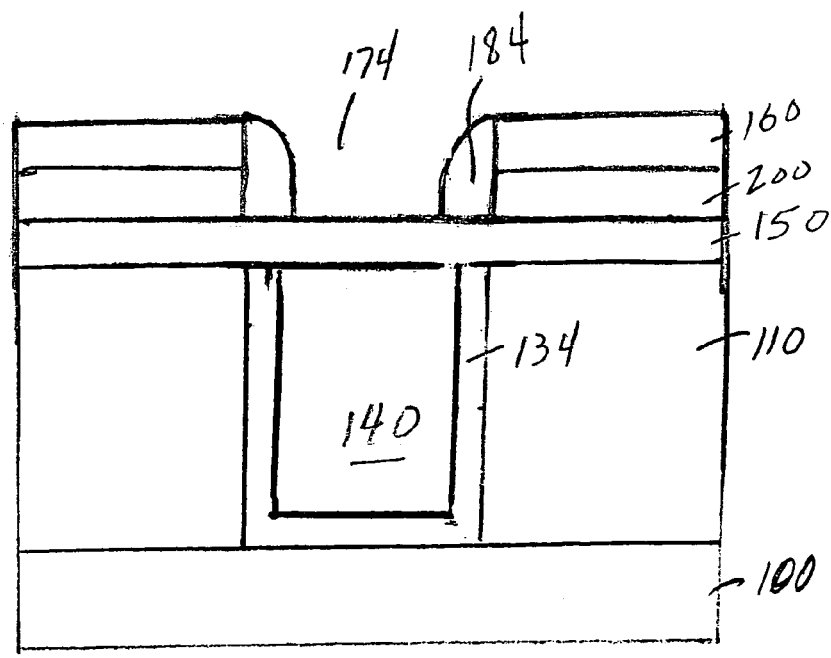

A method of making the embodiment of the memory element shown in FIG. 19 is shown in FIG. 14-19. FIG. 14 shows the memory element at an intermediate stage of development (similar to FIG. 8). Referring to FIG. 15, a first conductive material is deposited over the structure shown in FIG. 14 to form the resistive layer 150. A second conductive material is deposited over the resistive layer 150 to form the strapping layer 200. A dielectric layer 160 is deposited over the strapping layer 200. As shown in FIG. 16, an opening 170, extending to the resistive layer 150, is then patterned and etched into the dielectric layer 160 and the strapping layer 200. Referring to FIG. 17, a dielectric layer 180 is conformally deposited onto the top surface of the dielectric layer 160 as well as onto the sidewall surface and bottom surface of the opening 170. As shown in FIG. 18, the dielectric layer 180 is then anisotropically etched to remove the horizontally disposed portions. The remaining portion is a conductive sidewall spacer 184 disposed along the sidewall surface of the opening 170 and forming the smaller central opening or pore 174. A layer of programmable resistive memory material 190 in deposited into the pore and a conductive layer 194 is deposited over the memory material to form the upper electrode of the memory element.

Figure 20:
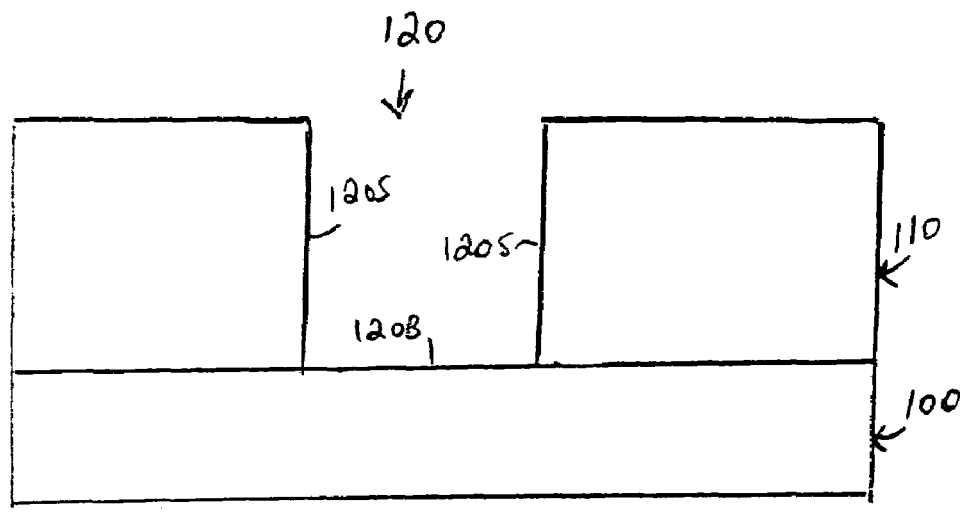
FIGS. 20 through 26 shows a process for making an embodiment of the memory cell of the present invention.
Figure 21:
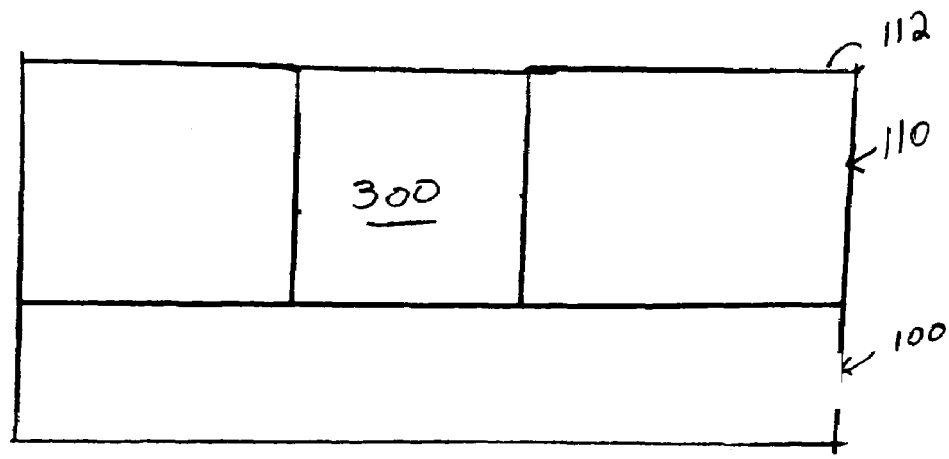
Figure 24:
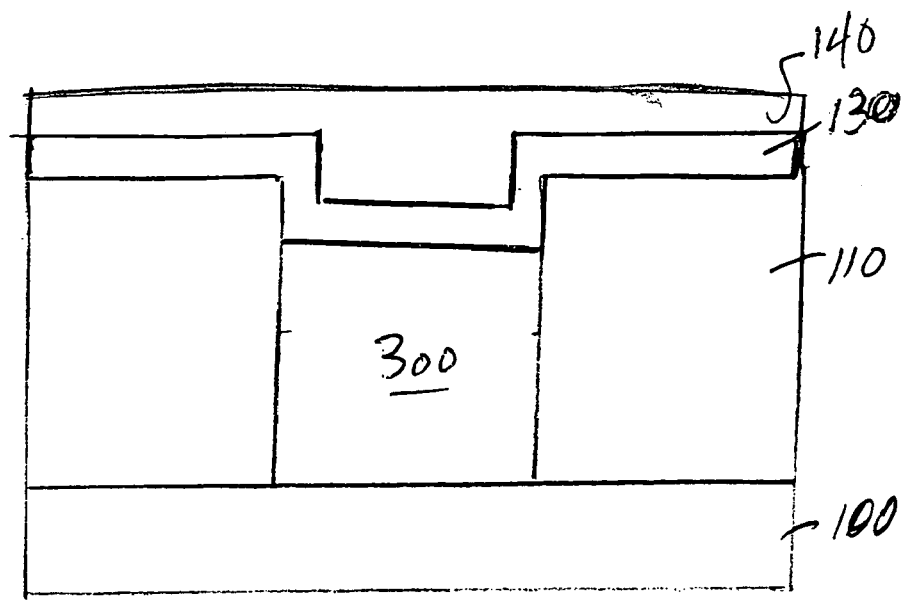
Figure 25:
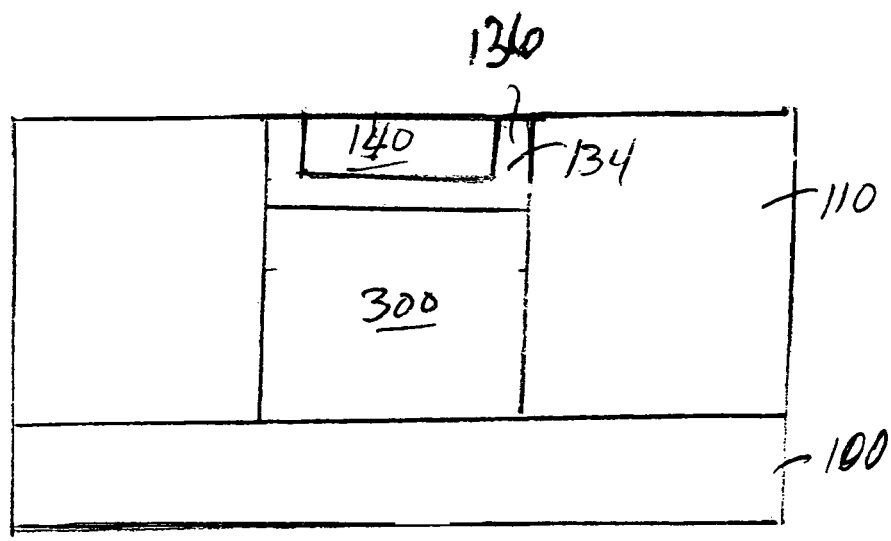
Figure 26:
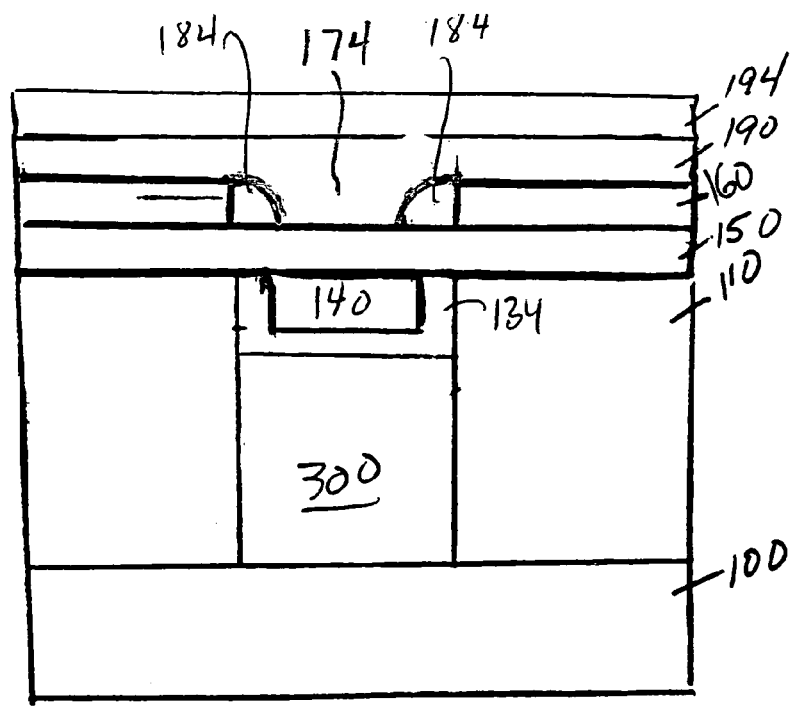

Yet another embodiment of the invention is shown in FIG. 26. In this embodiment, the memory element also includes a conductive plug 300 disposed between the substrate 100 and the bottom surface of the conductive liner 134. The plug 300 electrically couples the substrate to the conductive liner. A method of forming the memory element with the conductive plug (as shown in FIG. 26) is shown in FIGS. 20-26. Referring to FIG. 20, dielectric layer 110 is formed on substrate 100 and an opening 120 is formed through the dielectric layer 110 to expose a portion of the underlying substrate. Referring to FIG. 21, a conductive material 300 is deposited into the opening 120 and onto the top surface 112 of the dielectric layer 110 preferably by a CVD process. The conductive material 300 preferably fills the opening 120. The excess material above the top surface 112 of the dielectric layer 110 is removed by dry chemical etch, a mechanical planarization, a chemical-mechanical planarization (CMP) or other comparable methods selected in reference to the particular materials utilized. FIG. 21 shows the memory element after the plug 300 has been placed in the opening 120 and planarized. The plug 300 is substantially flush with the top surface 112 of the dielectric layer 110.

Figure 22:
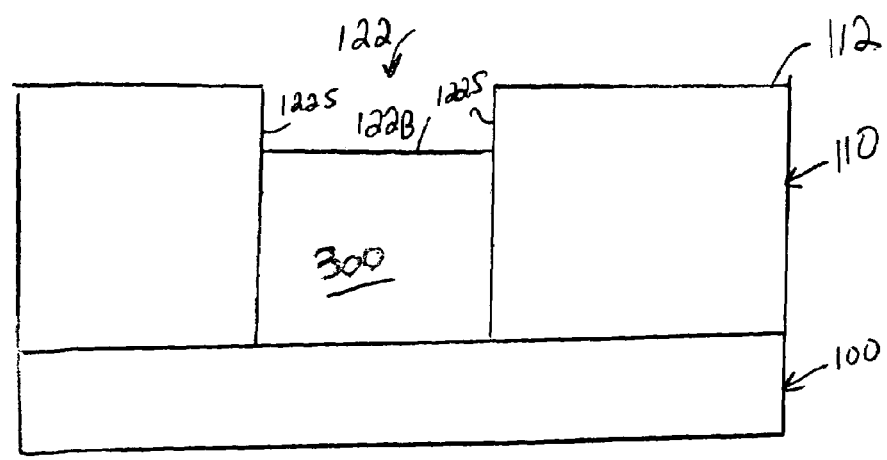

Referring to FIG. 22, the plug 300 is then recessed below the top surface 112 to leave free the upper cavity portion 122 of the opening 120. This can be accomplished by overetching during the excess-material removal dry chemical etch, or by another, subsequent etch process. The upper cavity portion 122 has a sidewall surface 122S as well as a bottom surface 122B (which corresponds to the top surface of the plug 300).

Figure 23:
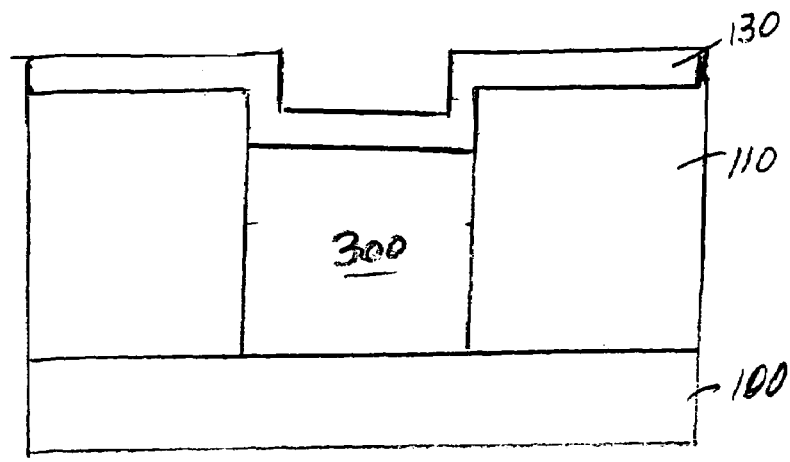

Referring to FIG. 23, conductive material 130 is conformally deposited onto the top surface 112 of the dielectric layer 110 and onto the sidewall surface 122S and bottom surface 122B of the upper cavity 122. Dielectric layer 140 is deposited over the layer 130 as shown in FIG. 24. The dielectric layer 140 and conductive layer 130 are then chemically mechanically polished to form the cylindrical conductive sidewall liner 134 with exposed edge portions 136 as shown in FIG. 25. The dimensions of the conductive liner will be determined substantially by the thickness of the conductive layer 134 deposition. The remaining process steps for forming the memory element shown in FIG. 26 have been discussed above and are similar to those shown in FIGS. 9-13.

Figure 27:
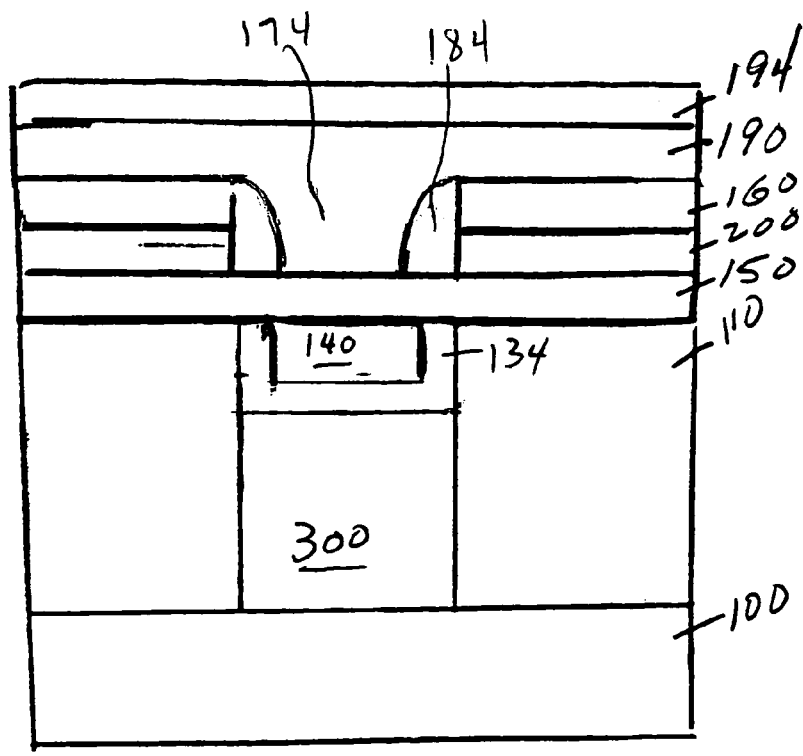
FIG. 27 shows an embodiment of the memory cell of the present invention.

Another embodiment of the invention is shown in FIG. 27. The embodiment shown in FIG. 27 is a modification of the embodiment shown in FIG. 26 wherein the optional strapping layer 200 has been added.

Figure 32:
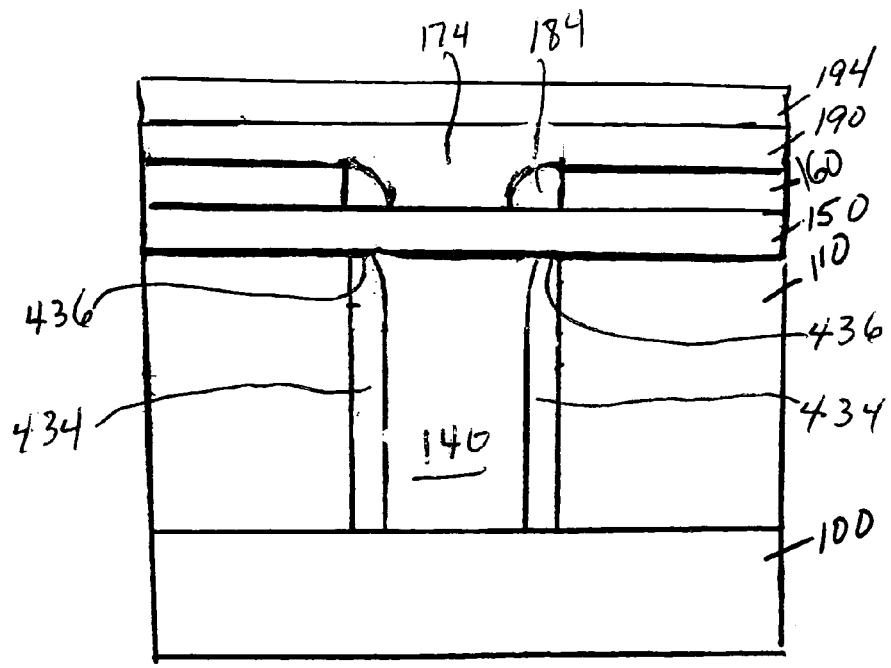

In the embodiment of the invention shown, for example, in FIG. 13, a conductive sidewall liner 134 electrically couples the resistive layer 150 to the substrate 100 while allowing placement of a dielectric material 140 under the portion of the the resistive layer which is underlying the pore 174 of memory material 190. An alternate embodiment of the invention is shown in FIG. 32 where the conductive sidewall liner 134 (shown in FIG. 13) is replaced with a conductive sidewall spacer 434. The conductive sidewall spacer 434 includes a sidewall layer disposed along the sidewall surface of the dielectric material 110. Like the conductive sidewall liner, the conductive sidewall spacer 434 includes an edge portion 436 adjacent to the memory material. The remainder of the sidewall spacer is remote to the memory material. Hence, all electrical communication between the conductive spacer 434 and the resistive layer 150 is through the edge portion 436. In the embodiment shown in FIG. 32, the conductive sidewall spacer 434 is substantially cylindrically shaped and the edge portion 436 is substantially annularly shaped. Other physical geometries for the conductive sidewall spacer are also possible. For example, the spacer may be formed in a trench, in which case, the edge portion 436 will be linear.

Like the conductive liner, the conductive spacer 434 provides electrical coupling between the resistive layer 150 and the substrate while allowing for placement of the dielectric material 140 under that portion of the resistive layer which is under the pore 174 of memory material, thereby increasing the heat energy transferred into and remaining inside of the memory material.

Figure 28:
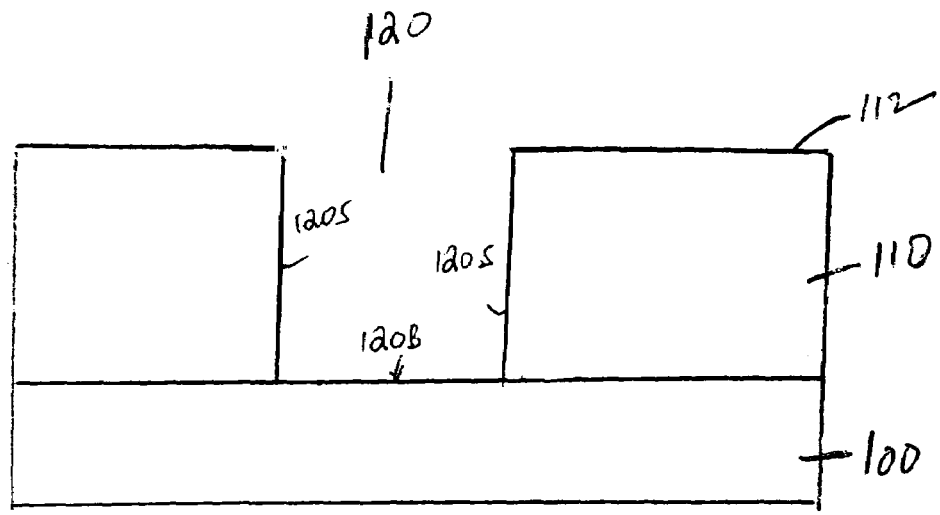
FIG. 28 through 32 shows a process for making an embodiment of the memory cell of the present invention.
Figure 29:
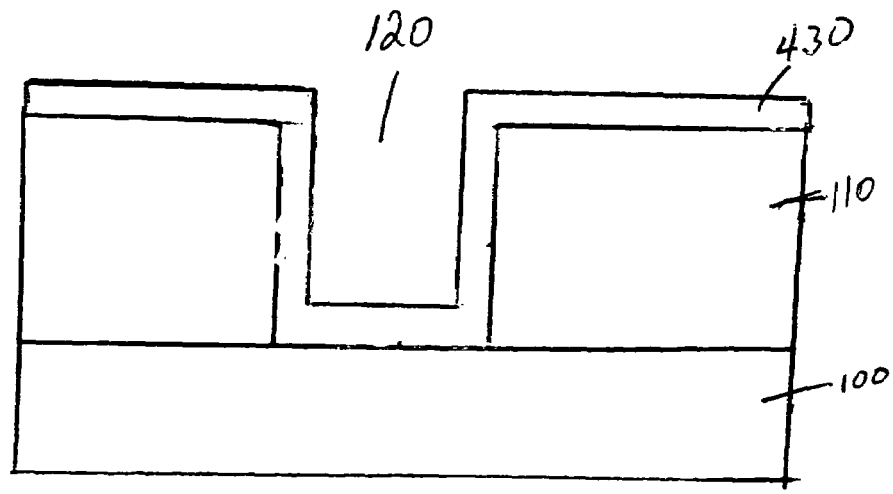
Figure 30:
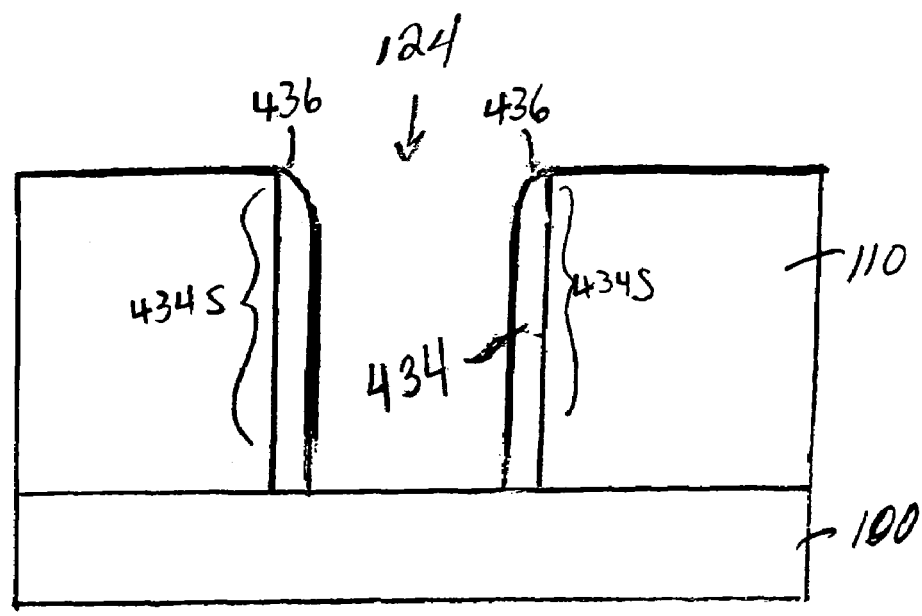

A method of making the memory element shown in FIG. 32 is shown in FIGS. 28-32. Referring to FIG. 28, dielectric layer 110 is formed on substrate 100 and an opening 120 is formed through the dielectric layer 110 to expose a portion of the underlying substrate. The opening 120 has sidewall surfaces 120S and bottom surface 120B. Referring to FIG. 28, the conductive layer 430 is deposited onto the top surface 112 of dielectric layer 110 as well as onto the sidewall surfaces 120S and bottom surface 120B of opening 120. The conductive layer 430 is anisotropically etched to remove the horizontally disposed portions thereby forming the cylindrical conductive sidewall spacer 434 shown in FIG. 30. The dimensions of the spacer 434 will be determined substantially by the thickness of the conductive layer 430. The spacer 434 does not completely fill the upper cavity 120 and instead leaves the central hole 124 all the way down to the substrate 100.

Figure 31:
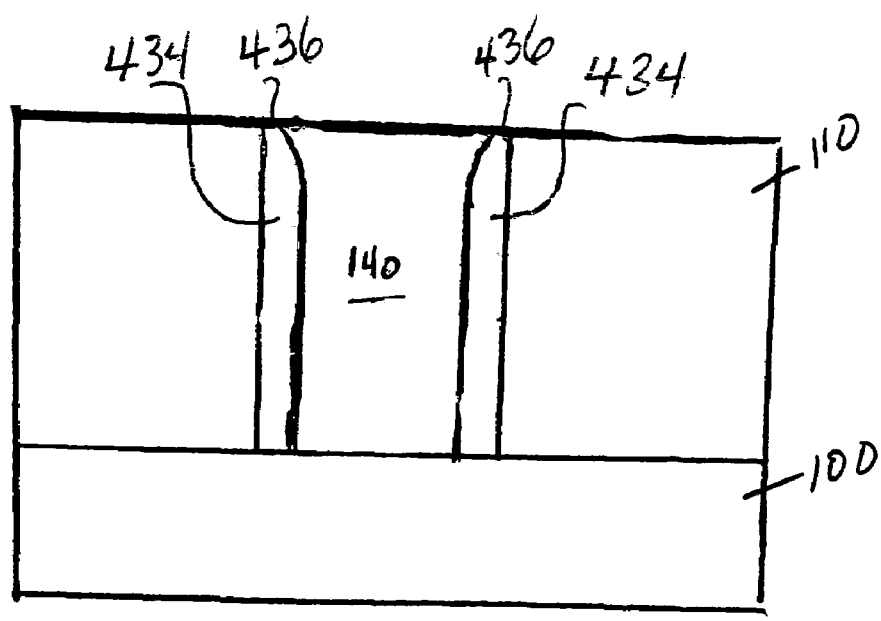

Referring to FIG. 31, a layer 140 of dielectric material is then deposited over the dielectric layer 110 and into the central hole 124 (preferably filling the central hole). The excess dielectric material 140 (i.e., material above the top surface 112) is removed using a dry chemical etch, a mechanical planarization, a chemical-mechanical planarization (CMP), or other methods that accomplish similar results. The remaining steps of forming the memory element shown in FIG. 32 are similar to the process steps shown in FIGS. 9-13.

Figure 33:
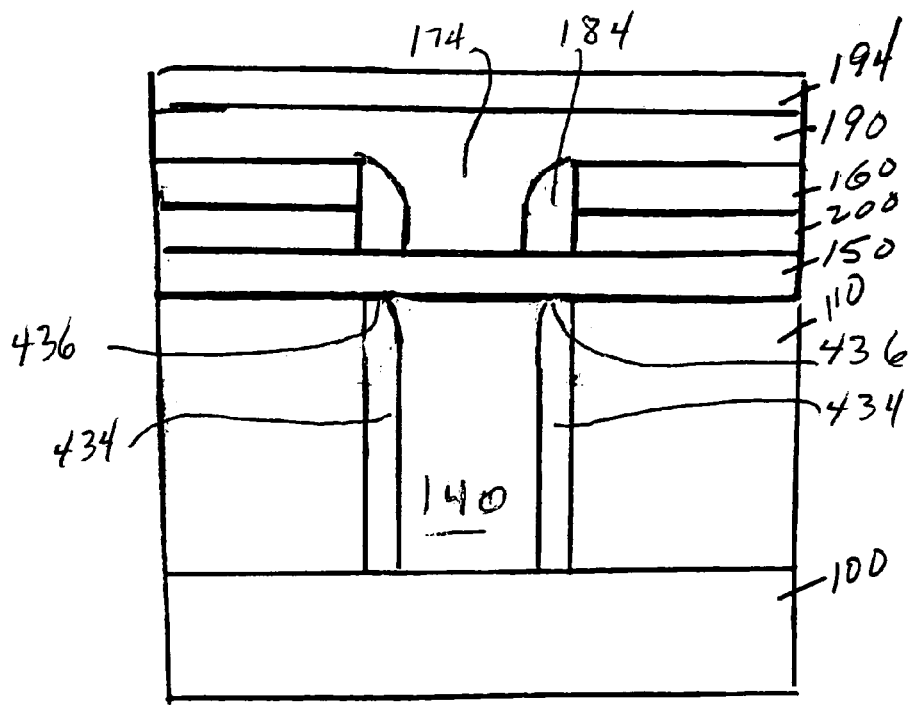
FIG. 33 shows an embodiment of a memory cell of the present invention.
Figure 34:
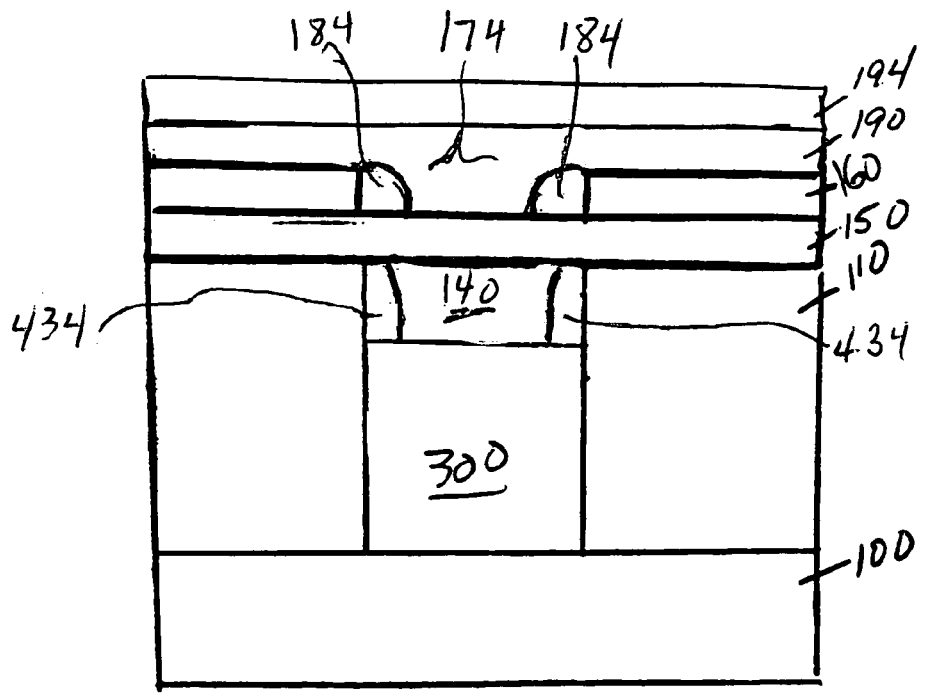
FIG. 34 is an embodiment of a memory cell of the present invention.
Figure 35:
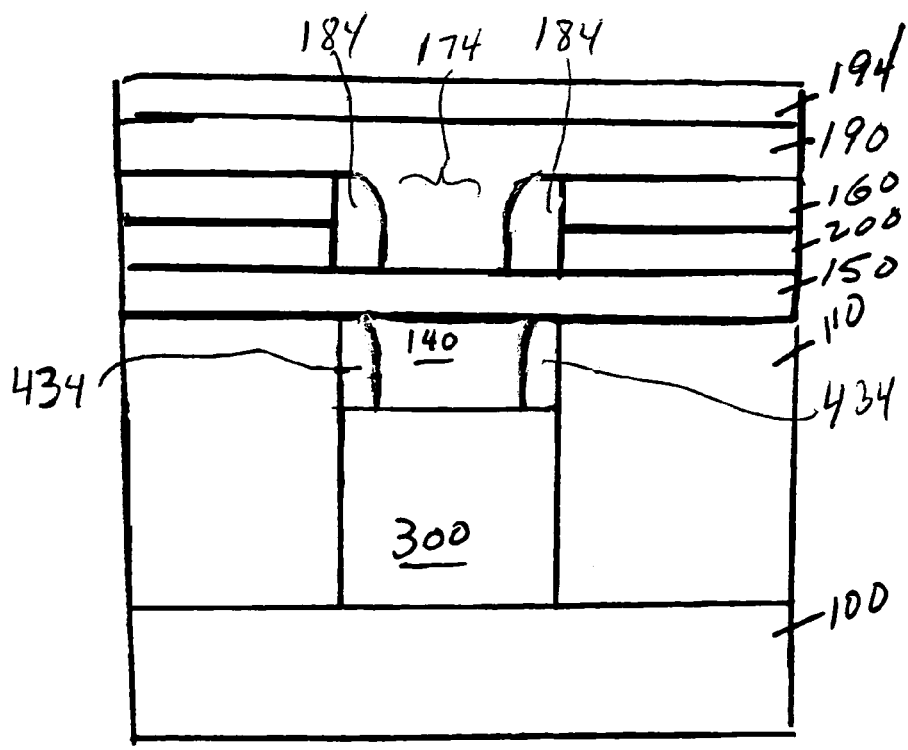
FIG. 35 is an embodiment of a memory cell of the present invention.

FIG. 33 shows an embodiment of the memory element which is similar to the embodiment shown in FIG. 32 except for the addition of the strapping layer 200. In addition, the conductive sidewall spacer 434 may be used in combination with a conductive plug 300 as shown in FIG. 34 as well as in combination with a conductive plug 300 and strapping layer 200 as shown in FIG. 35.

As noted above, the memory elements of the present invention may be electrically coupled to isolation/selection devices and to addressing lines in order to form a memory array. The isolation/addressing devices permit each discrete memory cell to be read and written to without interfering with information stored in adjacent or remote memory cells of the array. Generally, the present invention is not limited to the use of any specific type of isolation/addressing device. Examples of isolation/addressing devices include field-effect transistors, bipolar junction transistors, and diodes. Examples of field-effect transistors include JFET and MOSFET. Examples of MOSFET include NMOS transistors and PMOS transistors. Furthermore NMOS and PMOS may even be formed on the same chip for CMOS technologies. Hence, associated with each memory element of a memory array structure is isolation/addressing device which serves as an isolation/addressing device for that memory element thereby enabling that cell to be read and written without interfering with information stored in other adjacent or remote memory elements of the array.

The memory element of the present invention comprises a volume of memory material. Generally, the volume of memory material is a programmable resistance memory material which is programmable to at least a first resistance state and a second resistance state. The memory material is preferably programmed in response to electrical signals. Preferably, the electrical signals used to program the materials are electrical currents which are directed to the memory material.

In one embodiment, the memory material is programmable to two resistance states so that each of the memory elements is capable of storing a single bit of information. In another embodiment, the memory material is programmable to at least three resistance states so that each of the memory elements is capable of storing more than one bit of information. In yet another embodiment, the memory material is programmable to at least four resistance states so that each of the memory elements is capable of storing at least two bits of information. Hence, the memory materials may have a range of resistance values providing for the gray scale storage of multiple bits of information.

The memory materials may be directly overwritable so that they can be programmed from any of their resistance states to any other of their resistance states without first having to be set to a starting state. Preferably, the same programming pulse or pulses may be used to program the memory material to a specific resistance state regardless of its previous resistance state. (For example, the same current pulse or pulses may be used to program the material to its high resistance state regardless of its previous state). An example of a method of programming the memory element is provided in U.S. Pat. No. 6,075,719, the disclosure of which is incorporated by reference herein.

The memory material may be a phase change material. The phase-change materials may be any phase change memory material known in the art. Preferably, the phase change materials are capable of exhibiting a first order phase transition. Examples of materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein.

The phase change materials may be formed from a plurality of atomic elements. Preferably, the memory material includes at least one chalcogen element. The chalcogen element may be chosen from the group consisting of Te, Se, and mixtures or alloys thereof. The memory material may further include at least one element selected from the group consisting of Ge, Sb, Bi, Pb, Sn, As, S, Si, P, O, and mixtures or alloys thereof. In one embodiment, the memory material comprises the elements Te, Ge and Sb. In another embodiment, the memory material consists essentially of Te, Ge and Sb. An example of a memory material which may be used is $Te_2Ge_2Sb_5$.

The memory material may include at least one transition metal element. The term "transition metal" as used herein includes elements 21 to 30, 39 to 48, 57 and 72 to 80. Preferably, the one or more transition metal elements are selected from the group consisting of Cr, Fe, Ni, Nb, Pd, Pt and mixtures or alloys thereof. The memory materials which include transition metals may be elementally modified forms of the memory materials in the Te—Ge—Sb ternary system. This elemental modification may be achieved by the incorporation of transition metals into the basic Te—Ge—Sb ternary system, with or without an additional chalcogen element, such as Se.

A first example of an elementally modified memory material is a phase-change memory material which includes Te, Ge, Sb and a transition metal, in the ratio $(Te_aGe_bSb_{100-(a+b)})_cTM_{100-c}$ where the subscripts are in atomic percentages which total 100% of the constituent elements, wherein TM is one or more transition metals, a and b are as set forth herein above for the basic Te—Ge—Sb ternary system and c is between about 90% and about 99.99%. Preferably, the transition metal may include Cr, Fe, Ni, Nb, Pd, Pt and mixtures or alloys thereof.

A second example of an elementally modified memory material is a phase-change memory material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements, TM is one or more transition metals, a and b are as set forth hereinabove for the basic Te—Ge—Sb ternary system, c is between about 90% and 99.5% and d is between about 0.01% and 10%. Preferably, the transition metal may include Cr, Fe, Ni, Pd, Pt, Nb, and mixtures or alloys thereof.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. An electrically operated memory element comprising:
   a first dielectric layer having an opening therethrough;
   a first conductive layer lining the sidewall surface of the opening of said first dielectric layer;
   a second dielectric layer formed over said first conductive layer within said opening;
   a second conductive layer formed over a top surface of said first conductive layer and a top surface of said second dielectric layer;
   a third dielectric layer having an opening therethrough, at least portion of said opening of said third dielectric layer overlying said second dielectric layer; and
   a programmable resistance material disposed in said opening and in electrical communication with said second conductive layer.

2. The memory element of claim 1, wherein the resistivity of said second conductive layer is greater than the resistivity of said first conductive layer.

3. The memory element of claim 1, wherein said first conductive layer is cup-shaped.

4. The memory element of claim 1, wherein said programmable resistance material is a phase-change material.

5. The memory element of claim 1, wherein substantially all of said opening of said third dielectric layer overlies said second dielectric layer.

6. The memory element of claim 1, wherein said opening of said third dielectric layer is a hole.

7. The memory element of claim 1, wherein said opening of said third dielectric layer is a hole, substantially all of said hole overlies said second dielectric layer.

8. The memory element of claim 1, wherein said programmable resistance material comprises a chalcogenide material.

* * * * *